(12) United States Patent
Fest et al.

(10) Patent No.: US 11,508,500 B2
(45) Date of Patent: Nov. 22, 2022

(54) THIN FILM RESISTOR (TFR) FORMED IN AN INTEGRATED CIRCUIT DEVICE USING TFR CAP LAYER(S) AS AN ETCH STOP AND/OR HARDMASK

(71) Applicant: Microchip Technology Incorporated, Chandler, AZ (US)

(72) Inventors: Paul Fest, Chandler, AZ (US); Jacob Williams, Gilbert, AZ (US); Josh Kaufman, Scottsdale, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 232 days.

(21) Appl. No.: 17/071,442

(22) Filed: Oct. 15, 2020

(65) Prior Publication Data

US 2021/0272725 A1 Sep. 2, 2021

Related U.S. Application Data

(60) Provisional application No. 62/982,905, filed on Feb. 28, 2020.

(51) Int. Cl.

| | | |
|---|---|---|
| *H01C 17/00* | (2006.01) | |
| *H01C 7/00* | (2006.01) | |
| *H01L 49/02* | (2006.01) | |
| *H01L 27/06* | (2006.01) | |
| *H01C 17/30* | (2006.01) | |

(52) U.S. Cl.
CPC .......... *H01C 17/003* (2013.01); *H01C 7/006* (2013.01); *H01C 17/30* (2013.01); *H01L 27/0629* (2013.01); *H01L 28/24* (2013.01)

(58) Field of Classification Search
CPC ...... H01C 17/003; H01C 17/30; H01C 7/006; H01L 27/0629; H01L 28/24
See application file for complete search history.

(56) References Cited

U.S. PATENT DOCUMENTS 6,081,014 A * 6/2000 Redford ................ H01C 7/006
                                                    257/904
6,171,922 B1 * 1/2001 Maghsoudnia ......... H01L 28/24
                                                    438/669

(Continued)

OTHER PUBLICATIONS

International Search Report and Written Opinion, Application No. PCT/US2020/061748, 12 pages.

*Primary Examiner* — Kyung S Lee
(74) *Attorney, Agent, or Firm* — Slayden Grubert Beard PLLC

(57) ABSTRACT

A method is provided for forming a thin film resistor (TFR) in an integrated circuit (IC) device. A TFR film is formed and annealed over an IC structure including IC elements and IC element contacts. At least one TFR cap layer is formed, and a TFR etch defines a TFR element from the TFR film. A TFR contact etch forms TFR contact openings over the TFR element, and a metal layer is formed over the IC structure and extending into the TFR contact openings to form metal contacts to the IC element contacts and the TFR element. The TFR cap layer(s), e.g., SiN cap and/or oxide cap formed over the TFR film, may (a) provide an etch stop during the TFR contact etch and/or (b) provide a hardmask during the TFR etch, which may eliminate the use of a photomask and thereby eliminate post-etch removal of photomask polymer.

23 Claims, 41 Drawing Sheets

(56) References Cited

U.S. PATENT DOCUMENTS

| | | | |
|---|---|---|---|
| 2007/0008062 A1* | 1/2007 | Fivas | H01C 7/006 257/E21.004 |
| 2010/0295149 A1* | 11/2010 | Summerfelt | H01L 23/5223 257/532 |
| 2011/0128692 A1 | 6/2011 | Gaul et al. | 361/679.31 |
| 2013/0334659 A1* | 12/2013 | Liu | H01L 21/76834 257/532 |
| 2015/0187632 A1 | 7/2015 | Ali et al. | 257/537 |
| 2015/0318340 A1* | 11/2015 | Dirnecker | H01L 23/5223 257/533 |
| 2019/0229062 A1* | 7/2019 | Shin | H01L 23/53295 |
| 2019/0392967 A1 | 12/2019 | Leng et al. | |

\* cited by examiner

THIN FILM RESISTOR (TFR) FORMED IN AN INTEGRATED CIRCUIT DEVICE USING TFR CAP LAYER(S) AS AN ETCH STOP AND/OR HARDMASK

RELATED APPLICATION

This application claims priority to commonly owned U.S. Provisional Patent Application No. 62/982,905 filed Feb. 28, 2020, the entire contents of which are hereby incorporated by reference for all purposes.

TECHNICAL FIELD

The present disclosure relates to forming thin film resistors, e.g., systems and methods for forming a thin film resistor integrated in a semiconductor integrated circuit (IC) device.

BACKGROUND

Many integrated circuit ("IC") devices incorporate thin film resistors (TFRs), which provide various advantage over other types of resistors. For example, TFRs may be highly accurate, and may be finely tuned to provide a very precise resistance value. As another example, TFRs typical have smaller parasitic components which provides advantageous high frequency behavior. In addition, TFRs typically have a low temperature coefficient of resistance (TCR), e.g., after a suitable annealing process to "tune" the TCR to a near-zero value, which may provide stable operation over a wide range of operating temperatures. A TFR anneal may be performed at above 500° C., e.g., in the range of 500-525° C., to optimize the TCR value.

A TFR may include any suitable resistive film formed on or in an insulating substrate. Some common IC-integrated TFR resistive film materials include SiCr, SiCCr, TaN, and TiN, although any other suitable materials may be used. Fabricating integrated TFRs typically requires the addition of numerous processing steps to the backend IC integration flow, such as several expensive photomask processes. It would be advantageous to reduce the number of such steps, in particular the number of photomask processes, to reduce the cost of integrated TFR fabrication.

Another problem relates to forming and annealing TFRs in IC devices that use aluminum interconnect layers (e.g., interconnect layers formed from aluminum, aluminum copper, or aluminum silicon copper), due to the relatively low melting point of aluminum. A common aluminum interconnect layer is formed as a layer stack, for example, a Ti layer, followed by a TiN layer, followed by an AlSiC layer (or AlCu or Al layer), followed by a second Ti layer, and finally a second TiN layer. A typical TFR anneal, which may involve temperatures at or above 500° C., may negatively affect such an aluminum interconnect, which has an accepted anneal temperature limit of about 450° C. For example, in an aluminum interconnect layer stack described above, when a TFR if formed and annealed (e.g., at a temperature at or above 500° C.) after forming an aluminum interconnect layer stack, $TiAl_3$ may form at grain boundaries within the aluminum interconnect layer stack, which increases sheet resistance of the aluminum interconnect (e.g., by a factor of 50 or more), which may cause electromigration problems in the IC structure.

Yet another problem with certain TFR integration processes involves the formation of heavy polymer residue from a polymer photomask used for a TFR etch, e.g., during the formation of the TFR itself. It is typically difficult to prevent or fully remove such polymer residue, as a chemical clean process to remove such polymer residue may damage sensitive structures in the area, such as IC element contacts (e.g., tungsten vias) exposed to the chemical clean.

SUMMARY

Embodiments of the present invention address various problems with conventional TFR integrations by forming a thin film resistor (TFR) after forming IC elements (e.g., memory devices) and contacts (e.g., tungsten vias), but before forming a first metal/interconnect layer, often referred to as a "Metal 1" layer. By forming the TFR prior to forming the Metal 1 layer, a TFR anneal may be performed at temperatures that would negatively affect the material of the Metal 1 layer, for example where aluminum (or other metal have a low melting temperature) is used for the Metal 1 layer. Thus, forming the TFR prior to forming the Metal 1 layer (e.g. aluminum Metal 1 layer) allows a TFR anneal at an optimal temperature (e.g., to optimize a TCR value of the TFR film), for example an anneal at or above 500° C. (e.g., in the range of 500-525° C.). Thus, embodiments of the present invention allow formation and optimal annealing of a TFR in an IC production flow that utilizes aluminum interconnect.

As used herein, "forming" any particular material layer (or other structure) may include depositing the respective material layer, growing the respective material layer (e.g., growing an oxide layer), or otherwise forming the respective material layer, and may include various process steps known in the art with respect to forming various types of layers in an IC structure.

In addition, as used herein, an "etch process" may include a single etch, or multiple etches that may include different etch chemistries or other etch parameters.

In some embodiments, the process of forming the TFR includes only two added photomasks to the background IC production flow (i.e., the IC production flow without forming the TFR).

In some embodiments the TFR integration process includes forming a relatively thin nitride cap layer (e.g., a SiN cap layer) over the TFR film layer, which acts as an etch stop during a TFR contact etch for forming contact openings for coupling a metal interconnect layer (e.g., Metal 1 layer) to the TFR. The nitride cap layer may provide protection for underlying structures, e.g., tungsten vias or other IC element contacts, which may allow the use of a chemical clean (which is often harmful to unprotected structures) to remove photoresist polymer residue formed during the TFR etch process.

In other embodiments, a nitride cap layer (e.g., SiN cap layer) formed over the TFR film layer both (a) acts as a hardmask during a TFR etch for defining a TFR element from a TFR film layer, and (b) acts as an etch stop during a subsequent TFR contact etch for forming contact openings for coupling a metal interconnect layer (e.g., Metal 1 layer) to the TFR. By providing a nitride cap layer that acts as a hardmask during the TFR etch, existing photoresist material (if any) on the structure may be removed prior to performing the TFR etch, thereby eliminating or greatly reducing the formation of polymer material during the TFR etch process, and thus eliminating or reducing the need for a chemical clean of such polymer material. In addition, the nitride cap layer may protect underlying structures, e.g., tungsten vias or other IC element contacts, during the TFR contact etch.

In still other embodiments, an oxide cap layer is formed over the nitride cap layer, which layers collectively act as a hardmask during the TFR etch (for defining a TFR element from a TFR film layer) to reduce or eliminate the formation of polymer during the TFR etch. The oxide cap layer may be rounded during the TFR etch, which may help prevent the occurrence of electrical shorts ("stringers") along the TFR element and between adjacent metal layer structures (e.g., Metal 1 layer structures).

In one aspect of the invention, a method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A TFR film layer is formed over the IC structure, and a TFR etch stop cap layer is formed over the TFR film layer. A first etch process is performed to remove selected portions of the TFR etch stop cap layer and underlying portions of the TFR film layer, thereby defining an etch stop cap and underlying TFR element. A oxide cap layer is formed over the structure. A second etch is performed to form at least one oxide cap opening in the oxide cap layer over the TFR element, the second etch process stopping at the etch stop cap, and third etch process is performed through the at least one oxide cap opening to form at least one TFR contact opening in the etch stop cap, thereby exposing a surface of the TFR element. A metal interconnect layer is formed over the IC structure and includes (a) at least one metal interconnect element coupled to at least one of the plurality of conductive IC element contacts and (b) at least one metal interconnect extending into the at least one TFR contact opening to contact the underlying TFR element.

In some embodiments, a TFR anneal may be performed at any time after forming the TFR film layer but before depositing the metal interconnect layer, e.g., to reduce and/or optimize a thermal coefficient of resistance (TCR) of the TFR film layer or TFR element. For example, a TFR anneal may be performed before the first etch to define the TFR element, or may be performed after the first etch to define the TFR element and before or after forming the oxide cap layer, or at any other time after forming the TFR film layer but before depositing the metal interconnect layer. As used herein, "reducing" the TCR of the TFR film layer or TFR element means reducing an absolute value of the TCR value, i.e., moving the TCR closer to zero.

In some embodiments, the TFR anneal comprises annealing at a temperature of at least 500° C. In some embodiments, the TFR anneal comprises annealing at a temperature of 515° C.±10° C. for a duration of 15-60 minutes.

In some embodiments, the method further includes forming a dielectric etch stop layer over the over the IC structure prior to forming the TFR film layer, wherein the first etch stops at the dielectric etch stop layer.

In some embodiments, the IC structure includes a memory cell or transistor structure including at least one conductive IC element contact connected to at least one of a source region, a drain region, and a gate region of the memory cell or transistor structure.

In some embodiments, the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

In some embodiments, the etch stop cap comprises silicon nitride (SiN).

In some embodiments, the metal interconnect layer comprises aluminum.

In some embodiments, the second etch process comprises a wet etch.

In some embodiments, forming the metal interconnect layer includes forming a particular metal interconnect element defining a conductive connection between the TFR element and at least one of the plurality of conductive IC element contacts.

In another aspect of the invention, a method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A first etch stop layer (e.g., first SiN layer) is formed over the IC structure. A TFR film layer is formed over the first etch stop layer. A TFR hardmask cap layer (e.g., second SiN layer) is formed over the TFR film layer. A first photomask is formed and patterned over a portion of the TFR hardmask cap layer. A first etch process is performed to remove exposed portions of the TFR hardmask cap layer and underlying portions of the TFR film layer, thereby leaving a TFR hardmask cap and underlying TFR element, wherein the first etch process stops at the first etch stop layer. Remaining portions of the first photomask are removed. A oxide cap layer is then formed, and a second photomask is formed and patterned over the oxide cap layer with at least one second mask opening aligned over the TFR element. A second etch process is performed to form at least one oxide cap opening in the oxide cap layer over the TFR element, and remaining portions of the second photomask are removed. A third etch process is performed through the at least one oxide cap opening to form at least one TFR contact opening in the TFR hardmask cap over the TFR element, thereby exposing a surface of the TFR element. A metal interconnect layer is formed extending over the plurality of conductive IC element contacts and over the TFR hardmask cap and extending into the at least one TFR contact opening in the TFR hardmask cap. A third photomask is formed and patterned, and a fourth etch process is performed to remove selected portions of the metal interconnect layer to thereby define a plurality of metal interconnect elements.

In some embodiments, a TFR anneal may be performed at any time after forming the TFR film layer but before depositing the metal interconnect layer, e.g., to reduce and/or optimize a thermal coefficient of resistance (TCR) of the TFR film layer or TFR element. For example, a TFR anneal may be performed before the first etch to define the TFR element, or may be performed after the first etch to define the TFR element and before or after forming the oxide cap layer, or at any other time after forming the TFR film layer but before depositing the metal interconnect layer.

In another aspect of the invention, a method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A TFR film layer is formed over the IC structure, and a TFR hardmask cap layer is formed over the TFR film layer. A photomask is formed and patterned over the TFR hardmask cap layer, a first etch process is performed to remove selected portions of the TFR hardmask cap layer, thereby defining a TFR hardmask cap, the first etch process stopping at the TFR film layer, and the photomask is removed. After the photomask is removed, a second etch process is performed, in which the TFR hardmask cap acts as a hardmask, to remove selected portions of the TFR film layer, to thereby define a TFR element under the TFR hardmask cap. A oxide cap layer is formed over the structure. A third etch process is performed to form at least one oxide cap opening in the oxide cap layer over the TFR element, and a fourth etch process is performed through the at least one oxide cap opening to form at least one TFR contact opening in the TFR hardmask cap over the TFR element, thereby exposing a surface of the TFR element. A metal interconnect layer is formed over the IC structure, the metal interconnect layer including (a) at least one metal interconnect element coupled to at least one of the plurality of conductive IC element contacts and (b) at least one metal interconnect extending into the at least one TFR contact opening to contact the underlying TFR element.

In some embodiments, a TFR anneal may be performed at any time after forming the TFR film layer but before depositing the metal interconnect layer, e.g., to reduce and/or optimize a thermal coefficient of resistance (TCR) of the TFR film layer or TFR element. For example, a TFR anneal may be performed before forming the photomask over the TFR hardmask cap layer, or may be performed after the second etch to define the TFR element and before or after forming the oxide cap layer, or at any other time after forming the TFR film layer but before depositing the metal interconnect layer.

In some embodiments, the TFR anneal comprises annealing at a temperature of at least 500° C. In some embodiments, the TFR anneal comprises annealing at a temperature of 515° C.±10° C. for a duration of 15-60 minutes.

In some embodiments, the IC structure includes a memory cell or transistor structure including at least one conductive IC element contact connected to at least one of a source region, a drain region, and a gate region of the memory cell or transistor structure.

In some embodiments, the second etch process rounds upper corners of the TFR hardmask cap.

In some embodiments, the method further includes forming a dielectric etch stop layer over the over the IC structure prior to forming the TFR film layer, wherein the first etch stops at the dielectric etch stop layer In some embodiments, the TFR film layer comprises silicon carbide chromium (SiCCr), silicon chromium (SiCr), chromium silicon nitride (CrSiN), tantalum nitride (TaN), tantalum silicide (Ta$_2$Si), or titanium nitride (TiN).

In some embodiments, the TFR hardmask cap comprises silicon nitride (SiN).

In some embodiments, the metal interconnect layer comprises aluminum.

In some embodiments, the second etch process comprises a wet etch.

In some embodiments, forming the metal interconnect layer includes forming a particular metal interconnect element defining a conductive connection between the TFR element and at least one of the plurality of conductive IC element contacts.

In another aspect of the invention, another method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A first etch stop layer (e.g., first SiN layer) is formed over the IC structure. A TFR film layer is formed over the first etch stop layer. A TFR hardmask cap layer (e.g., second SiN layer) is formed over the TFR film layer. A first photomask is formed and patterned over a portion of the TFR hardmask cap layer. A first etch process is performed to remove exposed portions of the TFR hardmask cap layer, thereby leaving a TFR hardmask cap, wherein the first etch process stops at the TFR film layer. Remaining portions of the first photomask are removed. A second etch process is performed, in which the TFR hardmask cap acts as a hardmask, to remove exposed portions of the TFR film layer, to thereby define a TFR element under the TFR hardmask cap. The second etch process may round upper corners of the TFR hardmask cap. A oxide cap layer is formed over the structure. A second photomask is formed and patterned over the oxide cap layer with at least one second mask opening aligned over the TFR element. A third etch process is performed to form at least one oxide cap opening in the oxide cap over the TFR element, and remaining portions of the second photomask are removed. A fourth etch process is performed through the at least one oxide cap opening to form at least one TFR contact opening in the TFR hardmask cap over the TFR element, thereby exposing a surface of the TFR element. A metal interconnect layer is formed extending over the plurality of conductive IC element contacts and over the TFR hardmask cap and extending into the at least one TFR contact opening in the TFR hardmask cap. A third photomask is formed and patterned, and a fifth etch process is performed to remove selected portions of the metal interconnect layer to thereby define a plurality of metal interconnect elements.

In some embodiments, a TFR anneal may be performed at any time after forming the TFR film layer but before depositing the metal interconnect layer, e.g., to reduce and/or optimize a thermal coefficient of resistance (TCR) of the TFR film layer or TFR element.

In another aspect of the invention, a method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A TFR film layer is formed over the IC structure, an etch stop cap layer is formed over the TFR film layer, and an oxide cap layer is formed over the etch stop cap layer. A photomask is formed and patterned over the oxide cap layer, and a first etch process is performed to remove selected portions of the oxide cap layer, thereby defining an oxide cap, and the photomask is removed. After the photomask is removed, a second etch process is performed, in which the oxide cap acts as a hardmask, to remove selected portions of the etch stop cap layer and underlying TFR film layer, to thereby define an etch stop cap and an underlying TFR element under the oxide cap. A third etch process is performed to form at least one oxide cap opening in the oxide cap over the TFR element, and a fourth etch process is performed through the at least one oxide cap opening to form at least one TFR contact opening in the etch stop cap over the TFR element, thereby exposing a surface of the TFR element. A metal interconnect layer is formed over the IC structure, the metal interconnect layer including (a) at least one metal interconnect element coupled to at least one of the plurality of conductive IC element contacts and (b) at least one metal interconnect extending into the at least one TFR contact opening to contact the underlying TFR element.

In some embodiments, a TFR anneal may be performed at any time after forming the TFR film layer but before depositing the metal interconnect layer, e.g., to reduce and/or optimize a thermal coefficient of resistance (TCR) of the TFR film layer or TFR element.

In some embodiments, the IC structure includes a memory cell or transistor structure including at least one conductive IC element contact connected to at least one of a source region, a drain region, and a gate region of the memory cell or transistor structure.

In some embodiments, the second etch process rounds upper corners of the oxide cap.

In some embodiments, the method further includes forming a dielectric etch stop layer over the over the IC structure prior to forming the TFR film layer. wherein the first etch stops at the dielectric etch stop layer.

In some embodiments, the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

In some embodiments, the etch stop cap layer comprises silicon nitride (SiN).

In some embodiments, the metal interconnect layer comprises aluminum.

In some embodiments, the second etch process comprises a wet etch.

In some embodiments, forming the metal interconnect layer includes forming a particular metal interconnect element defining a conductive connection between the TFR element and at least one of the plurality of conductive IC element contacts.

In another aspect of the invention, another method is provided for forming an integrated thin film resistor (TFR) in a semiconductor integrated circuit device. An integrated circuit (IC) structure is provided, which may include a plurality of IC elements and a plurality of conductive IC element contacts connected to the plurality of IC elements. A first etch stop layer (e.g., first SiN layer) is formed over the IC structure. A TFR film layer is formed over the first etch stop layer. A TFR hardmask cap layer (e.g., second SiN layer) is formed over the TFR film layer. A oxide cap layer is formed over the TFR hardmask cap layer. A first photomask is formed and patterned over a portion of the oxide cap layer. A first etch is performed to remove exposed portions of the oxide cap layer, thereby leaving an oxide cap, wherein the first etch process stops at the etch stop cap layer, and remaining portions of the first photomask are removed. A second etch process is performed, in which the oxide cap acts as a hardmask, to remove exposed portions of the etch stop cap layer and underlying portions of the TFR film layer, to thereby define an etch stop cap and a TFR element under the etch stop cap. The second etch process may round upper corners of the oxide cap. A second photomask is formed and patterned with at least one second mask opening aligned over the TFR element. A third etch process is performed to form at least one oxide cap opening in the oxide cap over the TFR element, and remaining portions of the second photomask are removed. A fourth etch process is performed through the at least one oxide cap opening to form at least one TFR contact opening in the etch stop cap over the TFR element, thereby exposing a surface of the TFR element. A metal interconnect layer is formed extending over the plurality of conductive IC element contacts and over the oxide cap and extending into the at least one TFR contact opening in the etch stop cap. A third photomask is formed and patterned, and a fifth etch process is performed to remove selected portions of the metal interconnect layer to thereby define a plurality of metal interconnect elements.

In some embodiments, a TFR anneal may be performed at any time after forming the TFR film layer but before depositing the metal interconnect layer, e.g., to reduce and/or optimize a thermal coefficient of resistance (TCR) of the TFR film layer or TFR element.

In another aspect, semiconductor IC devices including a thin film resistor (TFR) produced according to any of the disclosed methods are provided.

BRIEF DESCRIPTION OF THE DRAWINGS

Example aspects of the present disclosure are described below in conjunction with the figures, in which:

FIGS. 4A-4C show a removal of selected portions of a metal layer deposited over a TFR oxide cap having rounded lateral edges, while FIGS. 5A-5C show a removal of selected portions of a metal layer deposited over a TFR oxide cap having vertical ("squared-off") lateral edges.

Figure 1A:
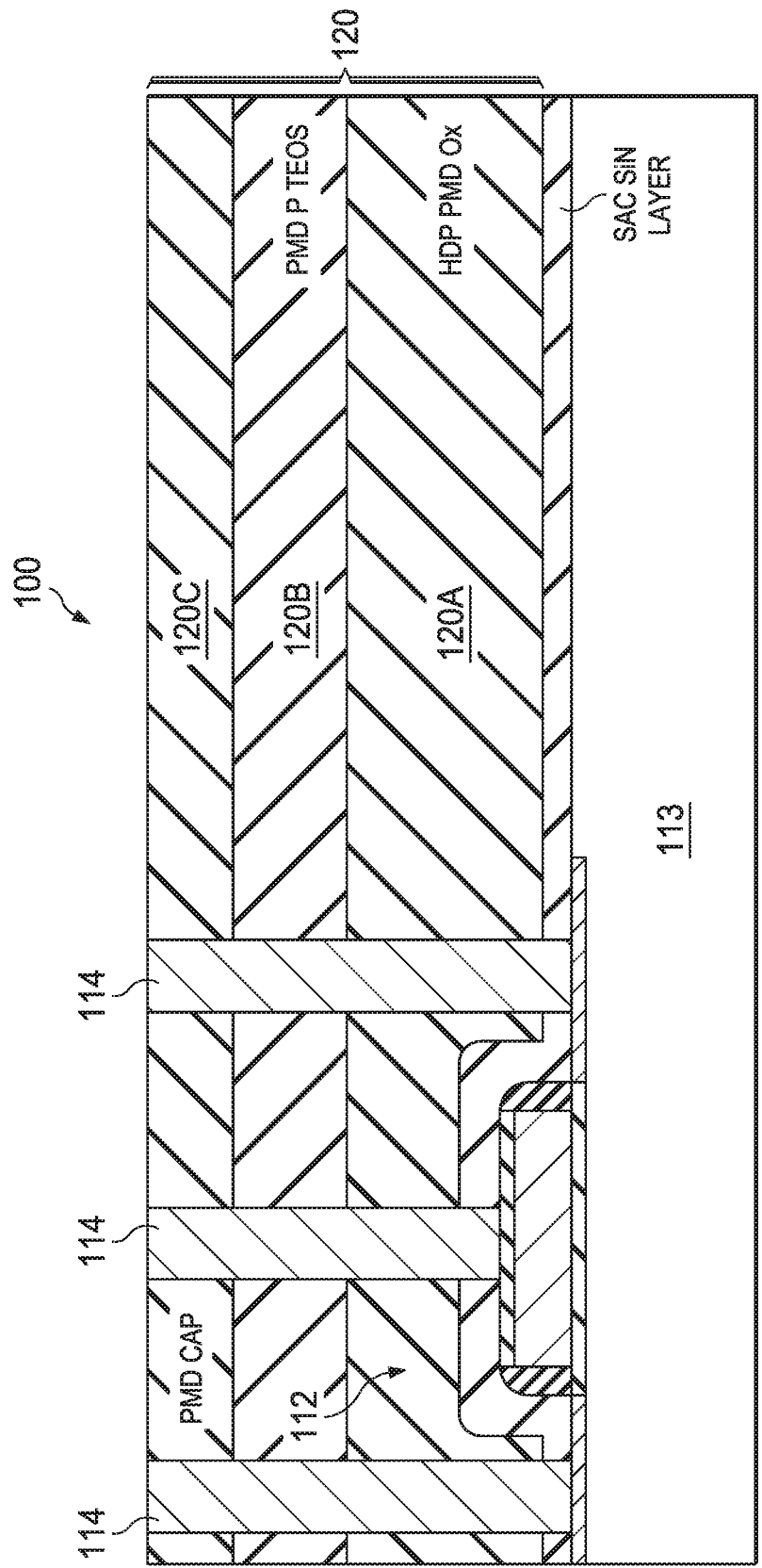
FIGS. 1A-1M illustrate steps of a first example method of integrating a thin film resistor (TFR) in a semiconductor integrated circuit (IC) device, according to a first example embodiment of the invention.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION OF THE INVENTION

Embodiments of the present invention provide an improved technique for integrating a thin film resistor (TFR) in a semiconductor integrated circuit (IC) device, which may provide a cost reduction as compared with conventional techniques, e.g., by allowing for TFR integration in combination with aluminum interconnect. In some embodiments, the TFR is formed after IC elements and IC element contacts (e.g. tungsten vias) are formed, but before the first metal/interconnect layer ("Metal 1" layer) is formed. This may allow a TFR anneal to be performed (e.g., to optimize the TCR value of the TFR film), for example at a temperature of 500° C. or above (e.g., in the range of 500-525° C.). Thus, an annealed TFR may be integrated into an IC device that uses aluminum interconnect, because the aluminum interconnect (which is generally not tolerant of the high temperatures experienced during a typical TFR anneal) is not formed until after the TFR anneal. The TFR anneal may be performed at any time in the process prior to depositing the first metal/interconnect layer.

Further, in some embodiments the process of forming the integrated TFR adds only two additional photomasks to the baseline IC production flow. In some embodiments, the TFR formation process includes forming a TFR etch stop layer (e.g., a SiN layer) over the IC structure (and under the TFR element), which protects underlying IC elements (e.g., memory elements and tungsten contacts) to thereby allow chemical cleans to be performed to remove polymer residue formed during at least one etch process. In addition, a second TFR etch stop layer (e.g., SiN layer) may be formed over the TFR element, which may act as an etch stop during a TFR contact etch for forming contact openings for coupling a metal interconnect layer (e.g., Metal 1 layer) to the TFR.

In other embodiments, a nitride cap (e.g., SiN cap) and/or an oxide cap formed over the TFR film layer collectively act as a hardmask during a TFR etch for defining a TFR element from a TFR film layer. Providing such a hardmask may remove the need to use a photomask for the TFR etch, to thereby eliminate or greatly reduce the formation of polymer material during the TFR etch process, thus eliminating or reducing the need for chemical cleans to remove such polymer material. In addition, the oxide cap layer may become rounded during the TFR etch, which may help prevent the occurrence of electrical shorts ("stringers") along the TFR element and between adjacent metal layer structures (e.g., Metal 1 layer structures).

FIGS. 1A-1M illustrate a first example method of integrating a thin film resistor (TFR) in a semiconductor integrated circuit (IC) device, according to a first example embodiment.

FIG. 1A illustrates an example integrated circuit (IC) structure 100, e.g., during the manufacturing of an IC device. In this example, the IC structure 100 includes a transistor structure 112 formed over a substrate 113, with a plurality of conductive contacts 114, e.g., tungsten vias, extending though a bulk insulation region 120 formed over the transistor structure 112. However, the IC structure 100 may include any other IC devices(s) or structure(s), e.g., one or more full or partial memory cells or memory cell structures, and conductive contacts associated with such structures. In this example embodiment, the bulk insulation region 120 includes (a) a high-density plasma (HDP) pre-metal dielectric (PMD) oxide layer 120A, (b) a PMD oxide film 120B, e.g., PMD P TEOS (phosphorous-doped tetra-ethyl orthosilicate film), and (c) a PMD cap layer 120C.

FIG. 1A may represent a state during an IC fabrication process after formation of tungsten vias 114 and a wet chemical mechanical polish (W CMP) process at the top of the structure 100.

Figure 1B:
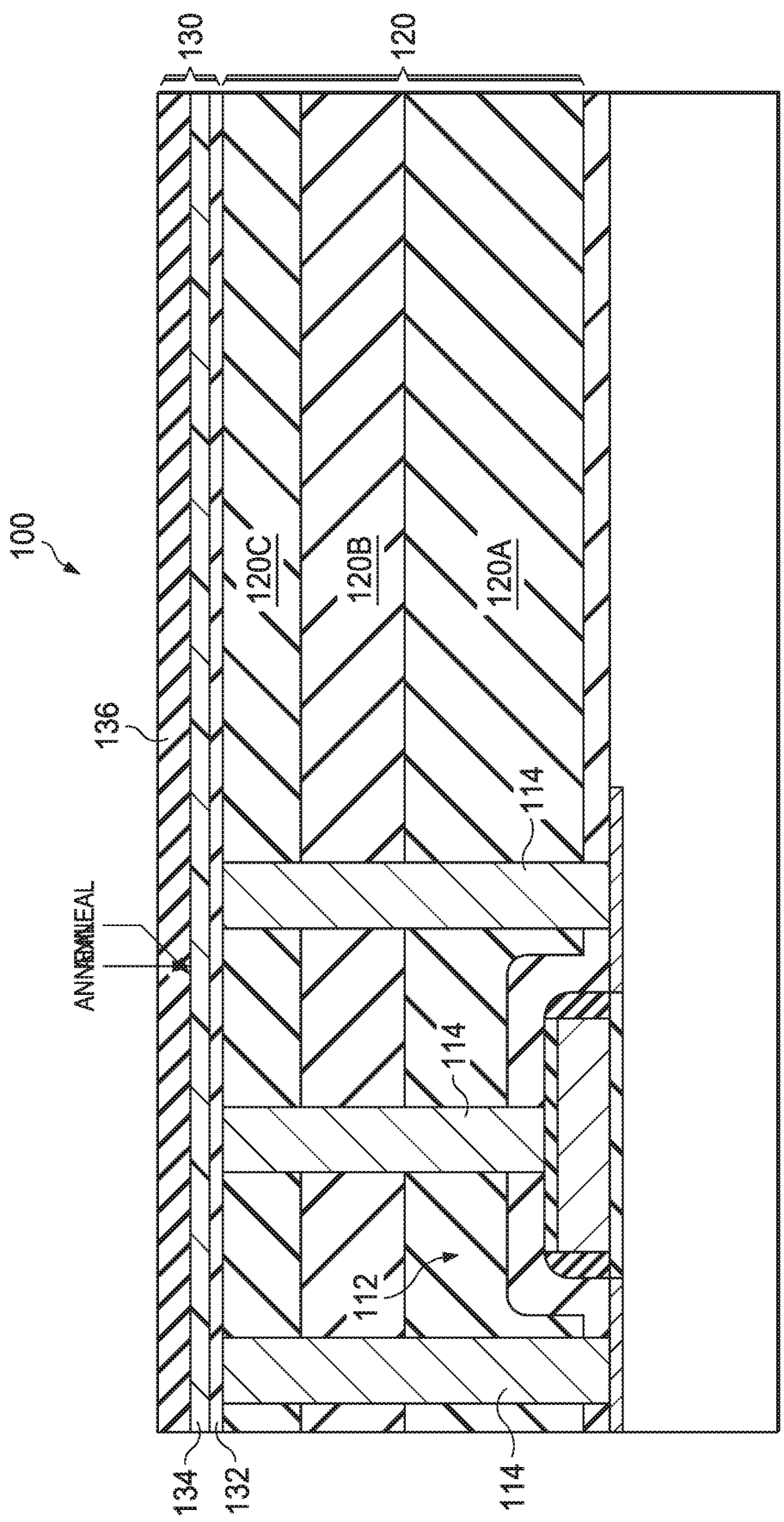

Next, as shown in FIG. 1B, a TFR layer stack 130 is formed over the bulk insulation region 120 and conductive contacts 114. First, a dielectric etch stop layer 132, e.g., a SiN layer, may be formed, e.g., to protect the tungsten vias 114 from a subsequent TFR etch shown below at FIG. 1D. A thin resistive film layer (TFR film layer) 134 may then be formed on the dielectric etch stop layer 132. The TFR film layer 134 may comprise, SiCCr, SiCr, TaN, TiN, or any other suitable TFR material.

In some embodiments, e.g., the example embodiment shown in FIGS. 1A-1M, a TFR anneal may be performed at this point, e.g., to tune or optimize a temperature coefficient of resistance (TCR) of the TFR film layer 134. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 160 (e.g., "Metal 1" layer) discussed below with reference to FIG. 1K. For example, in some embodiments, the TFR anneal may be performed after forming the TFR etch stop cap layer 136 discussed below. In other embodiments, the TFR anneal may be performed after etching to define the TFR element 134A discussed below with respect to FIG. 1D.

In other embodiments, the TFR anneal may be performed after completing the TFR contact etch described below with respect to FIG. 1J.

After the TFR anneal shown in FIG. 1B, a TFR etch stop cap layer 136 may be formed on the TFR film layer 134. In this embodiment, the TFR etch stop cap layer 136 comprises a SiN layer.

Figure 1C:
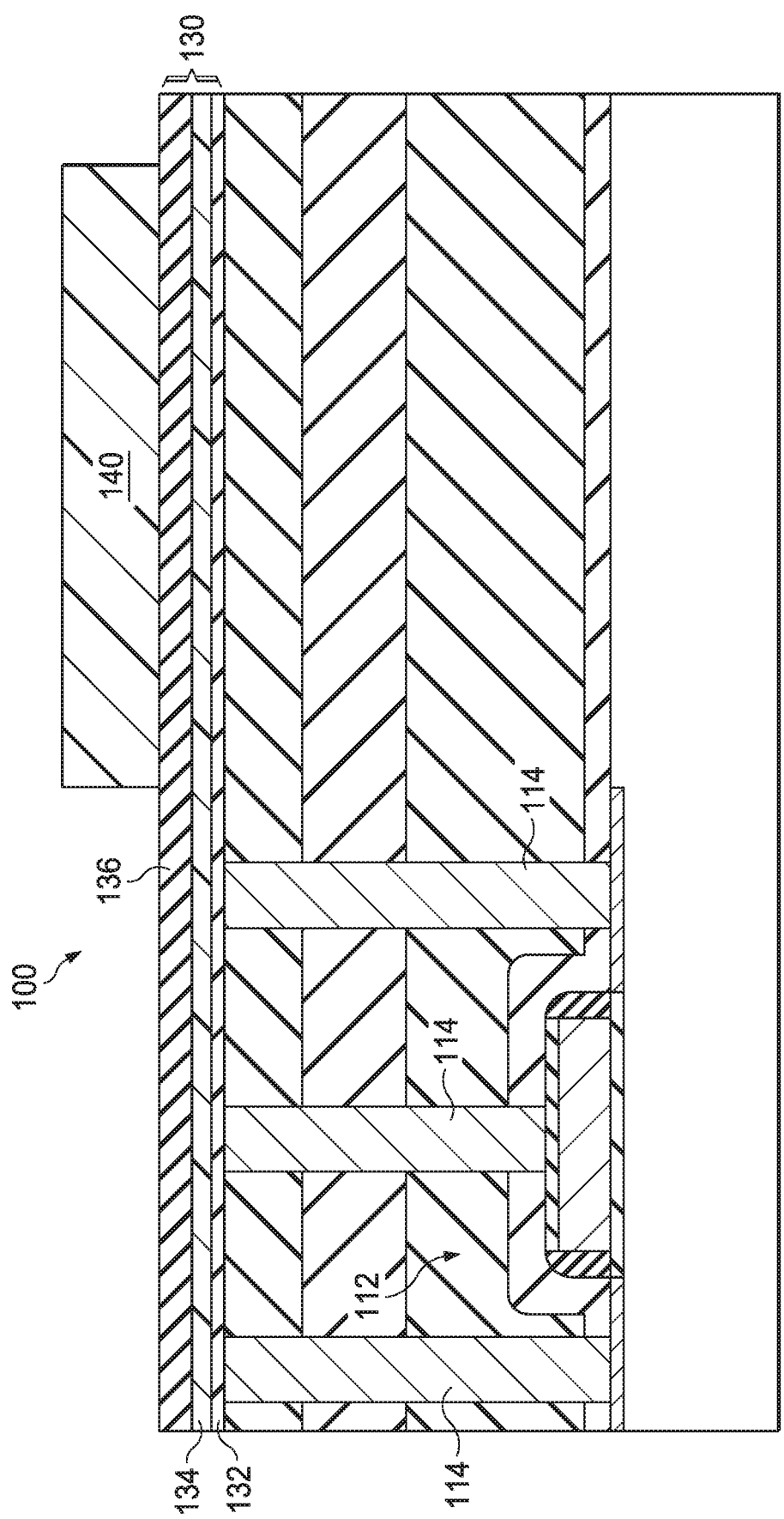

As shown in FIG. 1C, a first photomask 140 may be formed and patterned on the TFR etch stop cap layer 136 (e.g., using known photolithographic techniques) for forming a TFR, in this example at a location laterally offset from the underlying transistor structure 112.

Figure 1D:
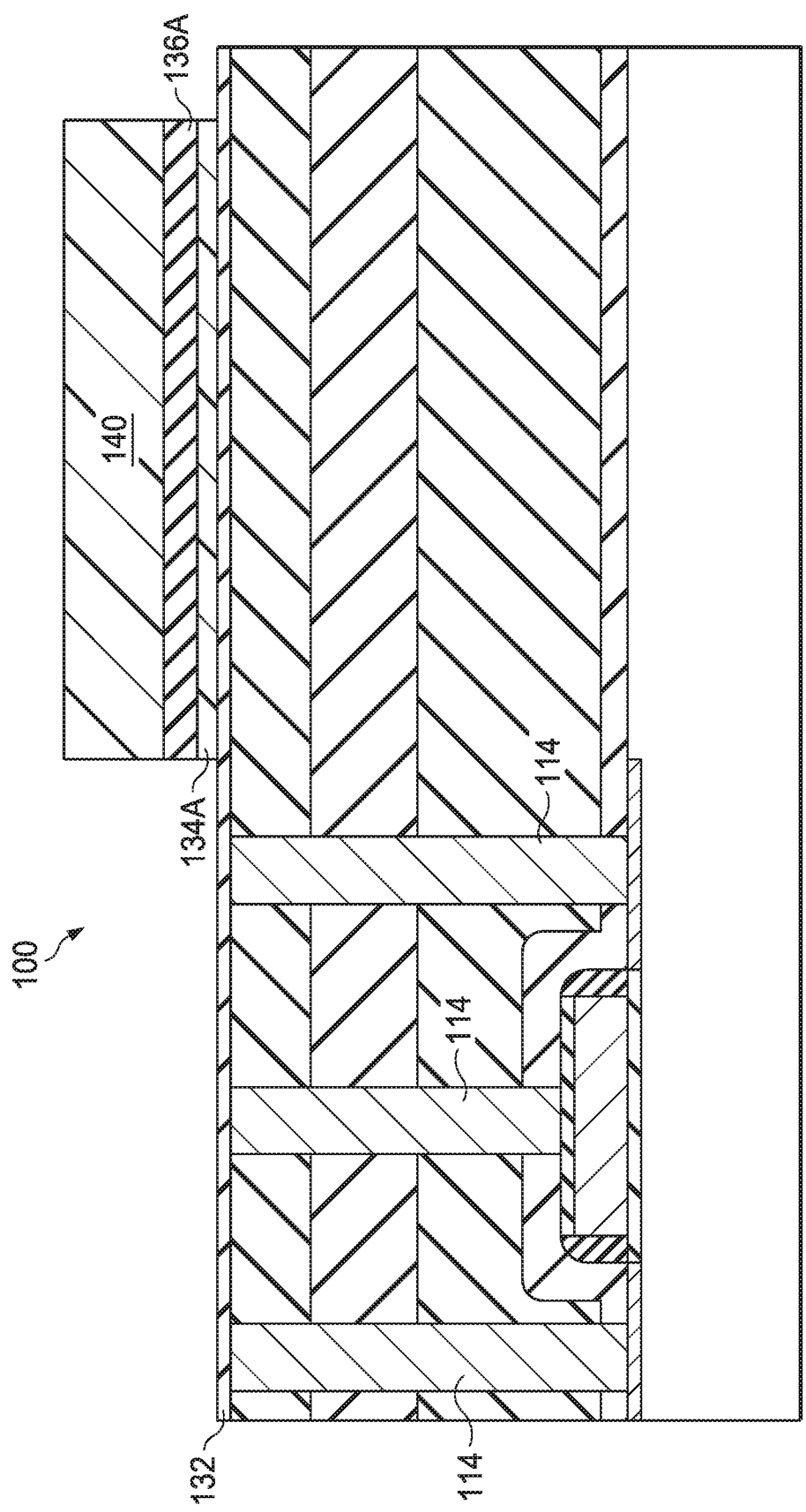

As shown in FIG. 1D, a dry etch may then be performed to remove exposed portions of the TFR etch stop cap layer 136 and underlying TFR film layer 134, to define an etch stop cap 136A and underlying TFR element 134A. As shown, the etch may be configured to stop at the dielectric etch stop layer 132, which may protect the underlying structure, including the tungsten contacts 114.

Figure 1E:
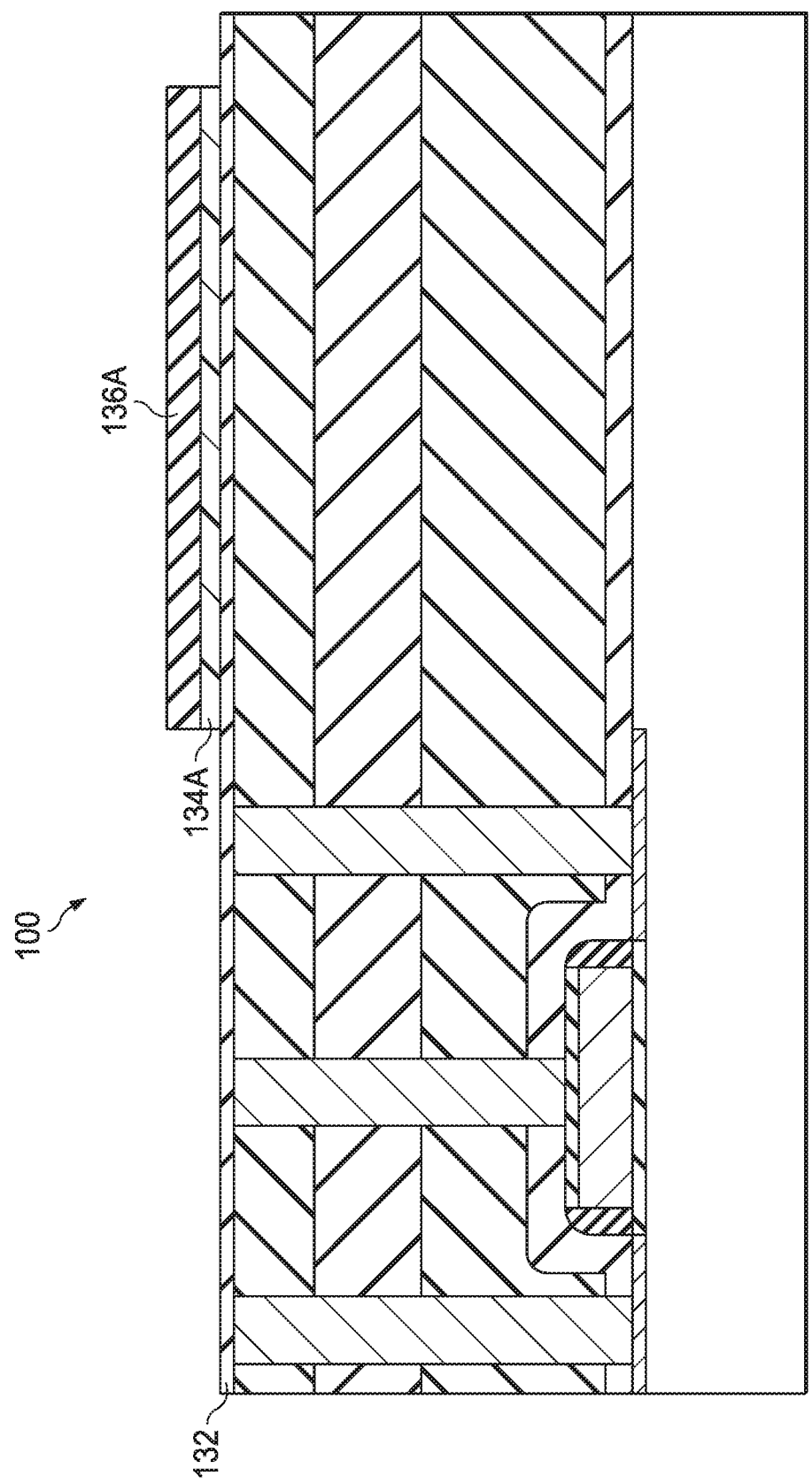

As shown in FIG. 1E, remaining portions of the photoresist 140 may be stripped to reveal the etch stop cap 136A. In some embodiments, a chemical clean may be used to strip the remaining portions of the photoresist 140, because the underlying tungsten contacts 114 are protected by the dielectric etch stop layer 132.

Figure 1F:
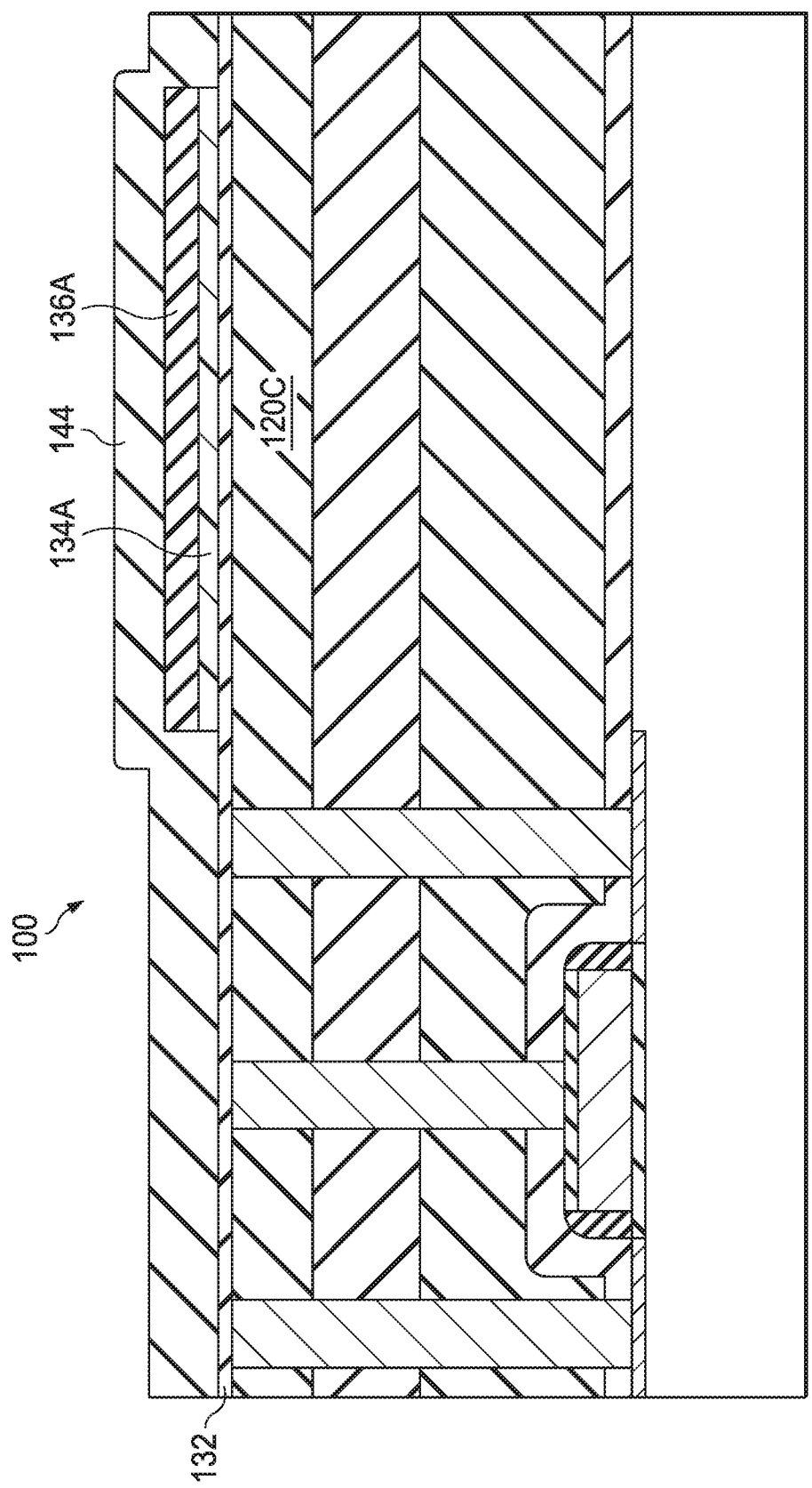

As shown in FIG. 1F, an oxide cap layer 144 is formed over the structure. In some embodiments, the oxide cap layer 144 may comprise the same material as the PMD cap layer 120C below the dielectric etch stop layer 132, but may have a reduced thickness as compared with the PMD cap layer 120C.

Figure 1G:
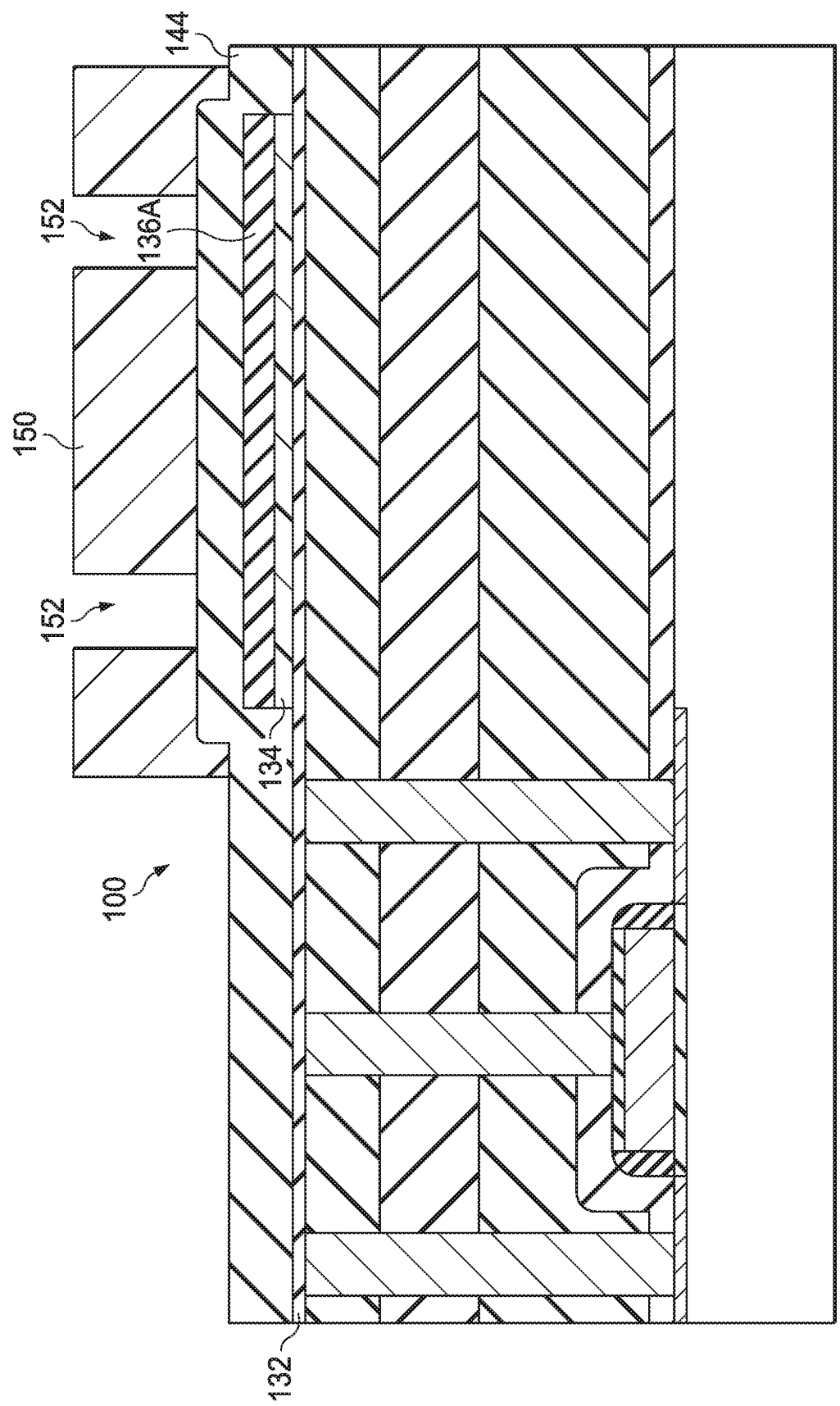

As shown in FIG. 1G, a second photomask 150 is formed on the oxide cap layer 144 and patterned over selected areas of the TFR etch stop cap 136A and TFR element 134A to define mask openings 152 aligned over the TFR element 134A.

Figure 1H:
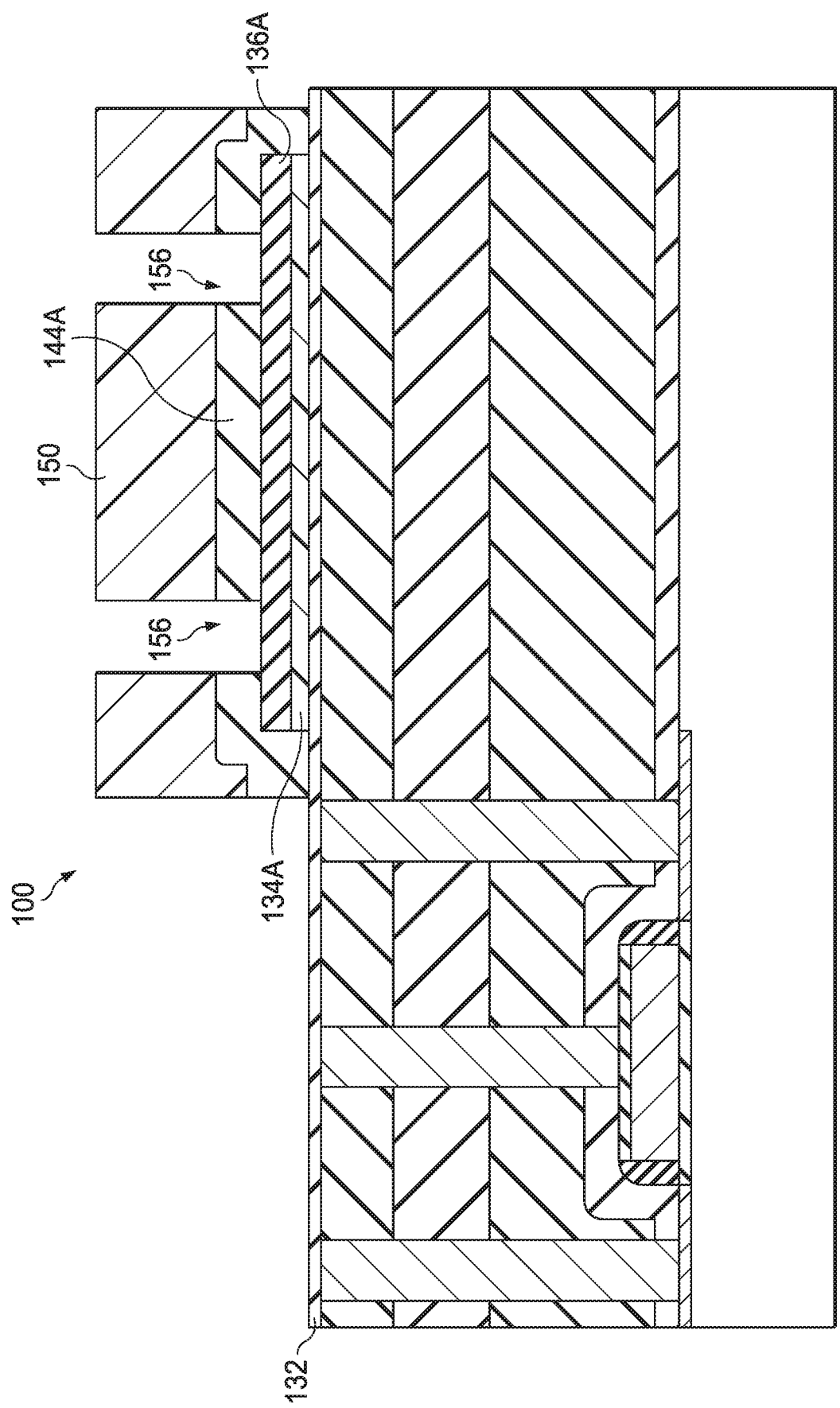

As shown in FIG. 1H, a first TFR contact etch is performed to (a) remove selected portions of the oxide cap layer 144 to define an oxide cap 144A having oxide cap openings 156. The first TFR contact etch may stop on the dielectric etch stop layer 132 at areas outside the outer perimeter of the photomask 150, and may stop on the etch stop cap 136A at the bottom of the oxide cap openings 156 within the outer perimeter of the photomask 150.

The first TFR contact etch may be a wet etch or a dry etch. A wet etch may improve the flow of metal during a subsequent metal deposition (e.g., the Metal 1 layer deposition shown in FIG. 1K), and may reduce the occurrence of electrical shorts (often referred to as "stringers") along the TFR element 134A and between adjacent metal structures (e.g., Metal 1 layer structures).

Figure 1I:
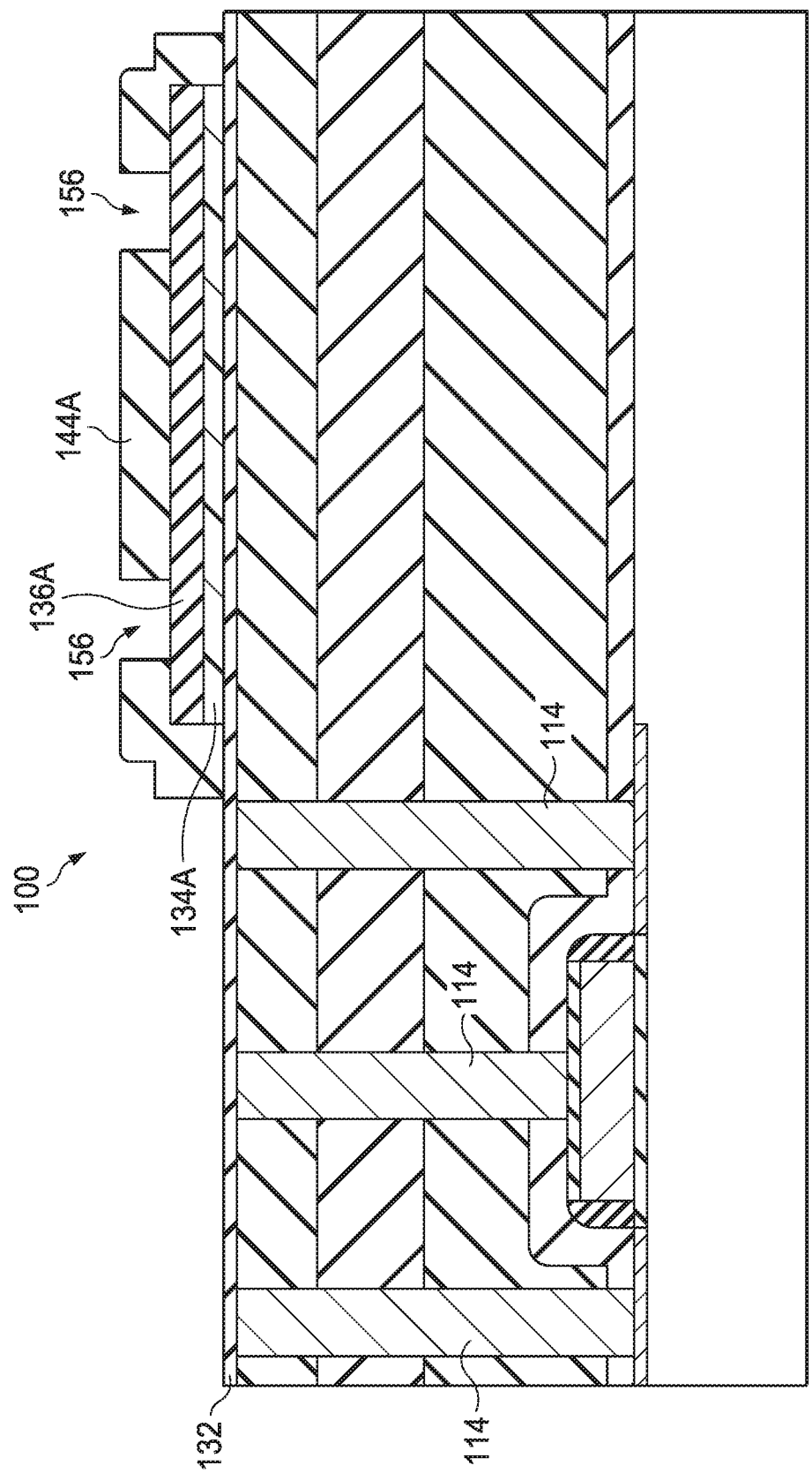

As shown in FIG. 1I, remaining portions of the photomask 150 may be removed, e.g., by a resist strip. In some embodiments, a chemical clean may be used to remove remaining portions of the photomask 150 because underlying IC structures, e.g., the tungsten vias 114, are protected by the dielectric etch stop layer 132.

Figure 1J:
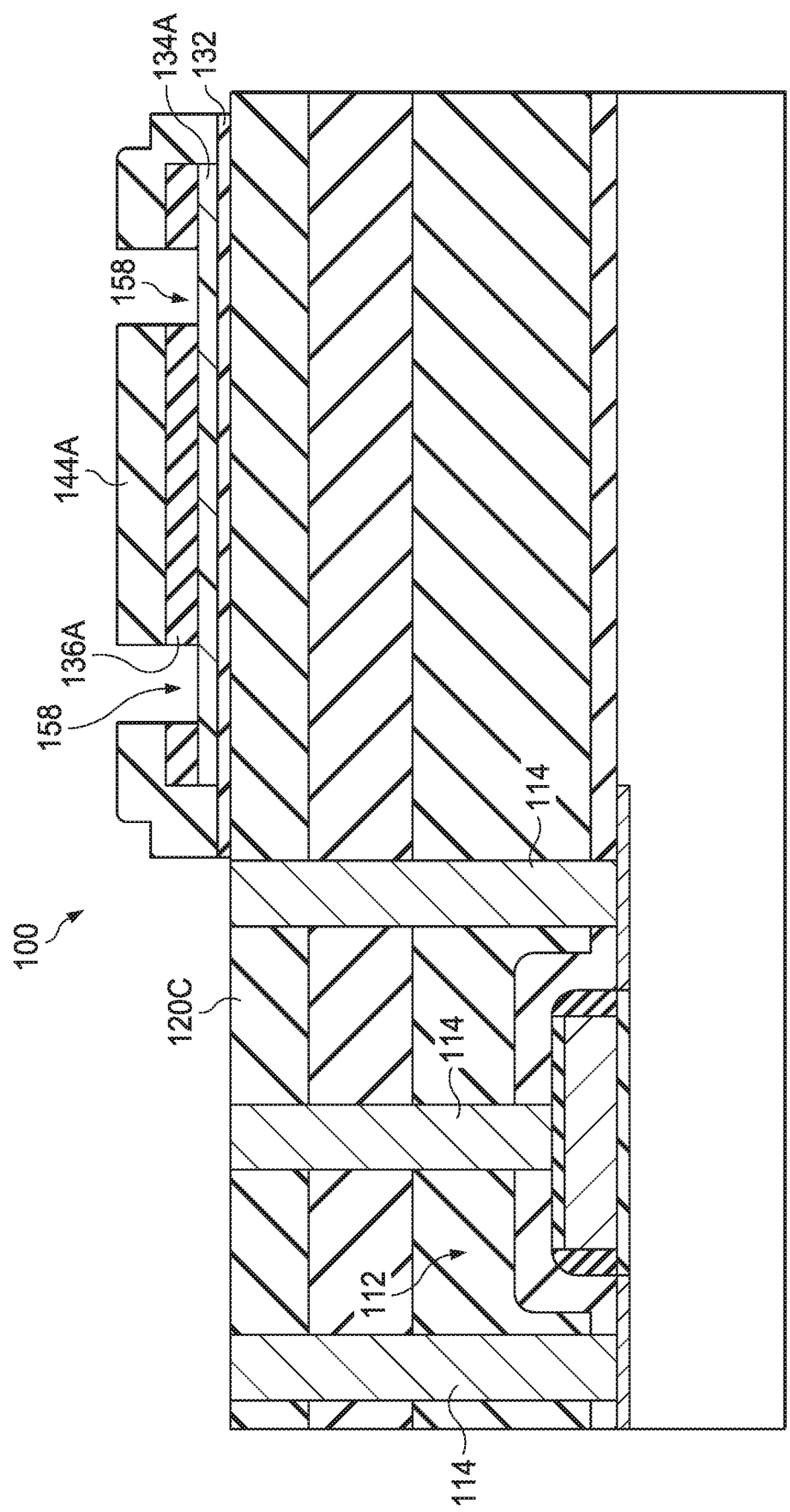

As shown in FIG. 1J, a second TFR contact etch may be performed to (a) remove portions of the TFR etch stop cap 136A exposed through the oxide cap openings 156 in the oxide cap 144A to define TFR contact openings 158 that expose a top surface of the TFR element 134A and (b) remove portions of the dielectric etch stop layer 132 exposed outside the perimeter of the oxide cap 144A, which may expose a top surface of the PMD cap layer 120C and the underlying tungsten contacts 114. In an embodiment in which dielectric etch stop layer 132 comprises a SiN layer, the second TFR contact etch may comprise a gentle SiN clear etch with high selectivity to oxide, to protect the underlying tungsten contacts 114.

Figure 1K:
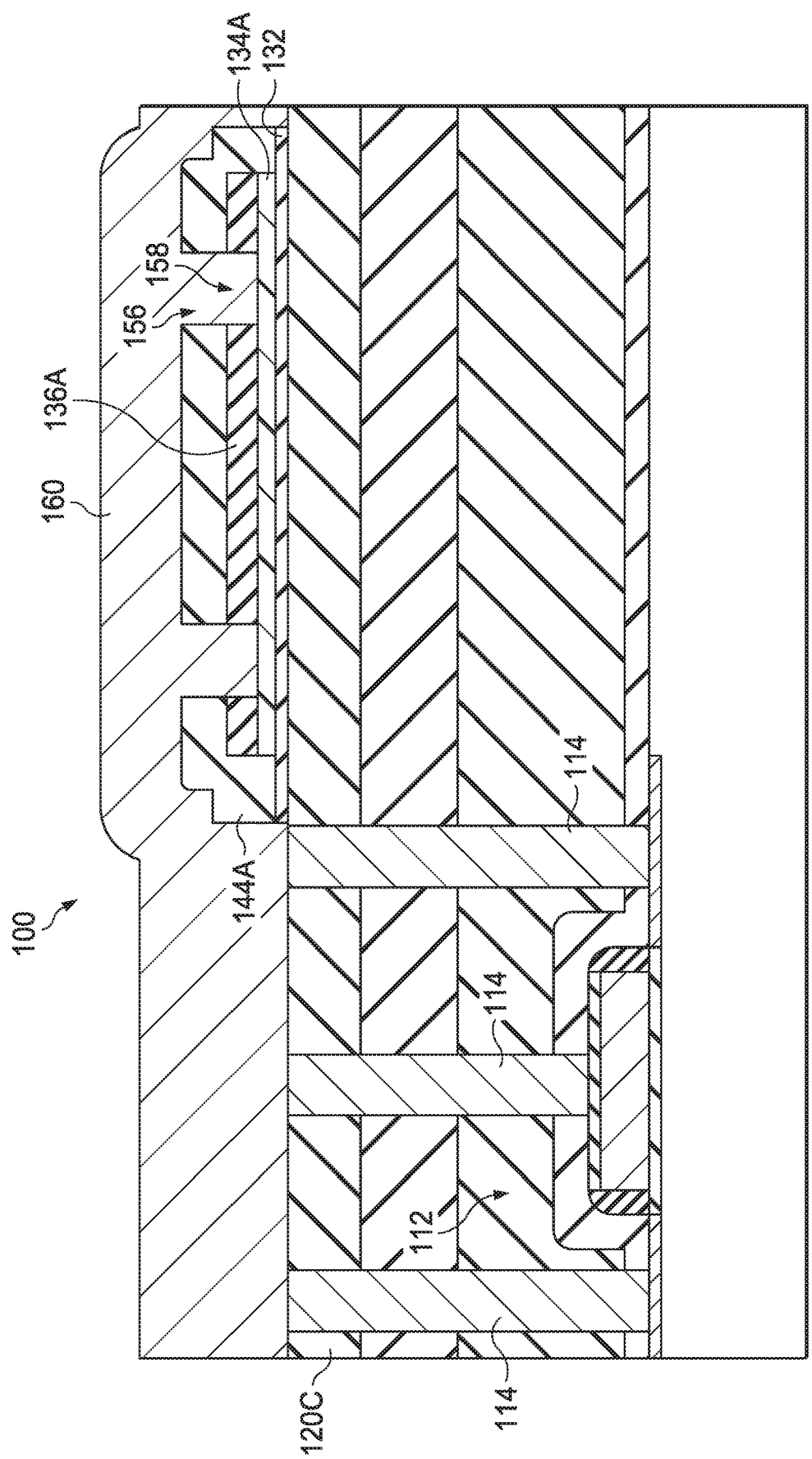

As shown in FIG. 1K, the IC device processing may continue, by forming a first metal layer/interconnect layer, referred to as a "Metal 1" layer 160. In the illustrated embodiment, Metal 1 layer 160 comprises aluminum. In other embodiments, Metal 1 layer 160 may comprise copper or other metal. As shown, Metal 1 layer 160 extends into the oxide cap openings 156 and TFR contact openings 158, to thereby contact the TFR element 134A at disparate contact locations of the TFR element 134A, e.g., at contact locations at or near opposing lateral sides or ends of the TFR elements 134A. Metal 1 layer 160 also extends over, and is in contact with, tungsten contacts 114.

Figure 1L:
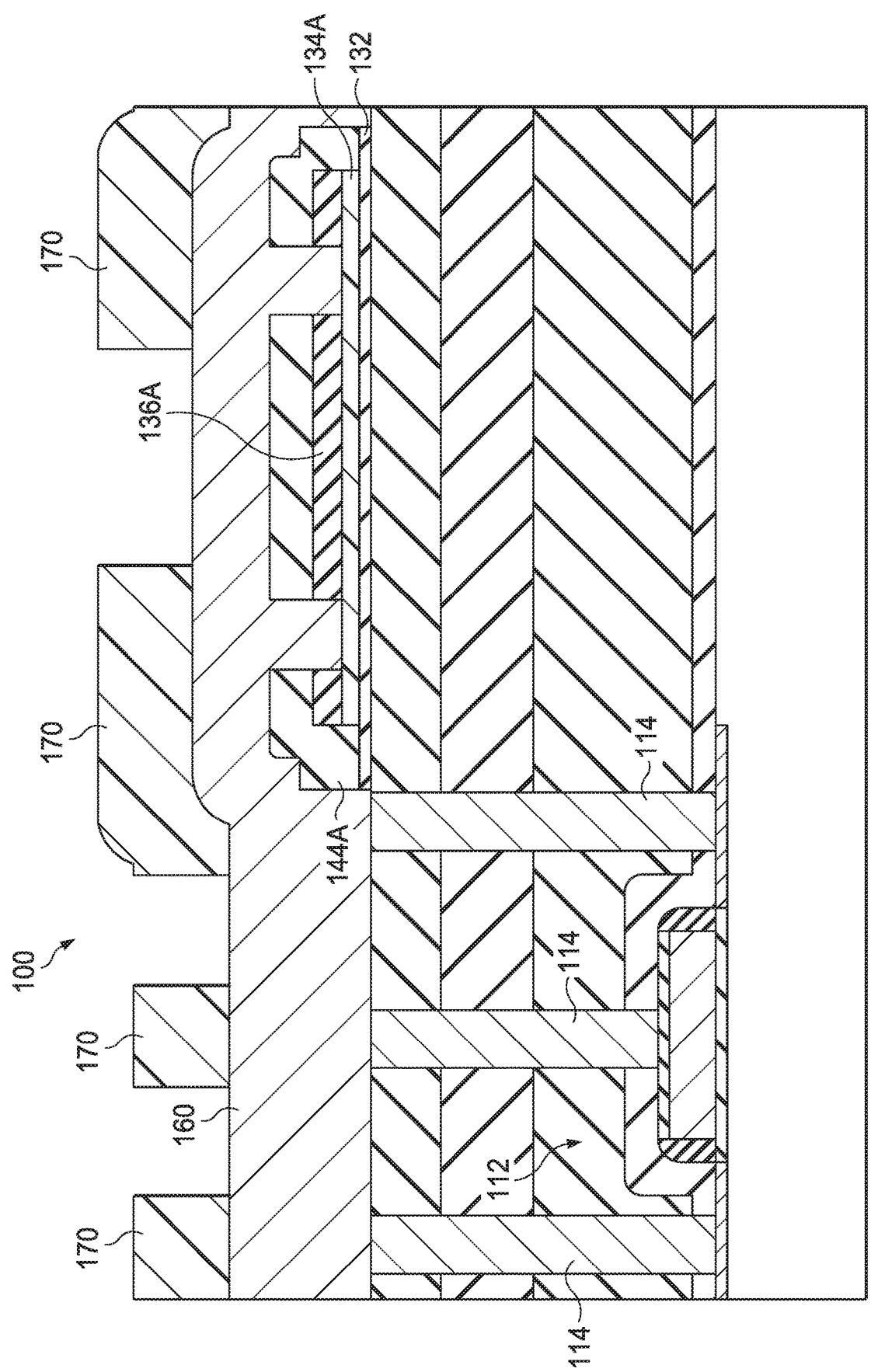

Next, as shown in FIG. 1L, a third photomask 170 may be formed and patterned over the Metal 1 layer.

Figure 1M:
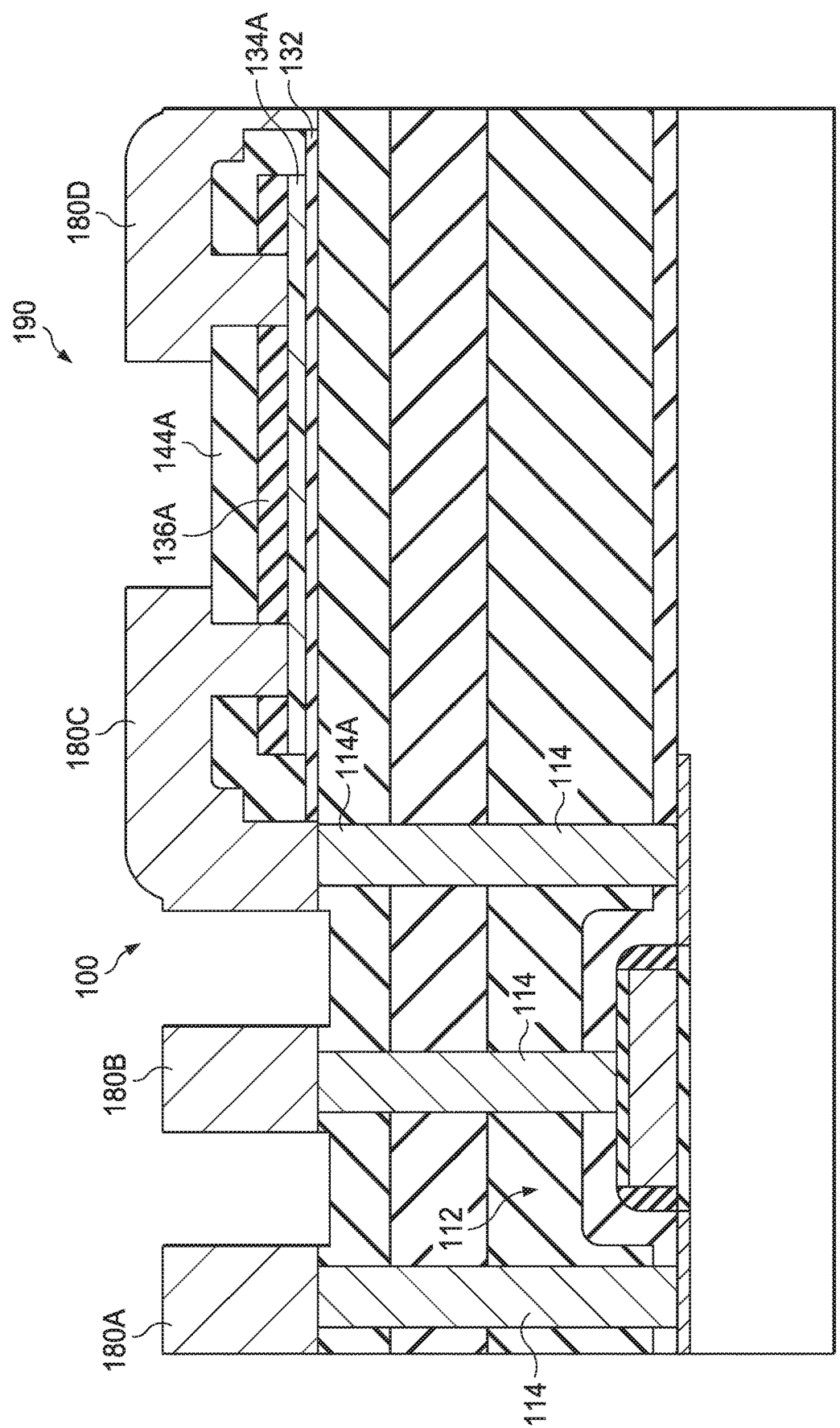

Finally, as shown in FIG. 1M, the aluminum Metal 1 layer 160 may be etched using the third photomask 170 to define a plurality of aluminum Metal 1 elements (e.g., metal interconnect elements) 180A-180D, and the remaining photoresist material 170 of FIG. 1L may then be removed. For example, as shown, the Metal 1 layer may be etched to define aluminum interconnect elements 180A and 180B in contact with tungsten vias 114, and aluminum interconnect elements 180C and 180D in contact with the disparate contact locations of the TFR element 134A. In this example illustration, a first aluminum interconnect element 180C conductively connects a first contact location of the TFR element 134A with a tungsten via 114A coupled to a source or drain region of the transistor 112, and a second interconnect element 180D conductively contacts a second contact location of the TFR element 134A with other IC element structure(s) (not shown). The TFR element 134A and the first and second interconnect elements 180C and 180D collectively define an integrated TFR, indicated at 190.

FIGS. 2A-2M illustrate an example method of integrating a thin film resistor (TFR) in a semiconductor integrated circuit (IC) device, according to one example embodiment.

Figure 2A:
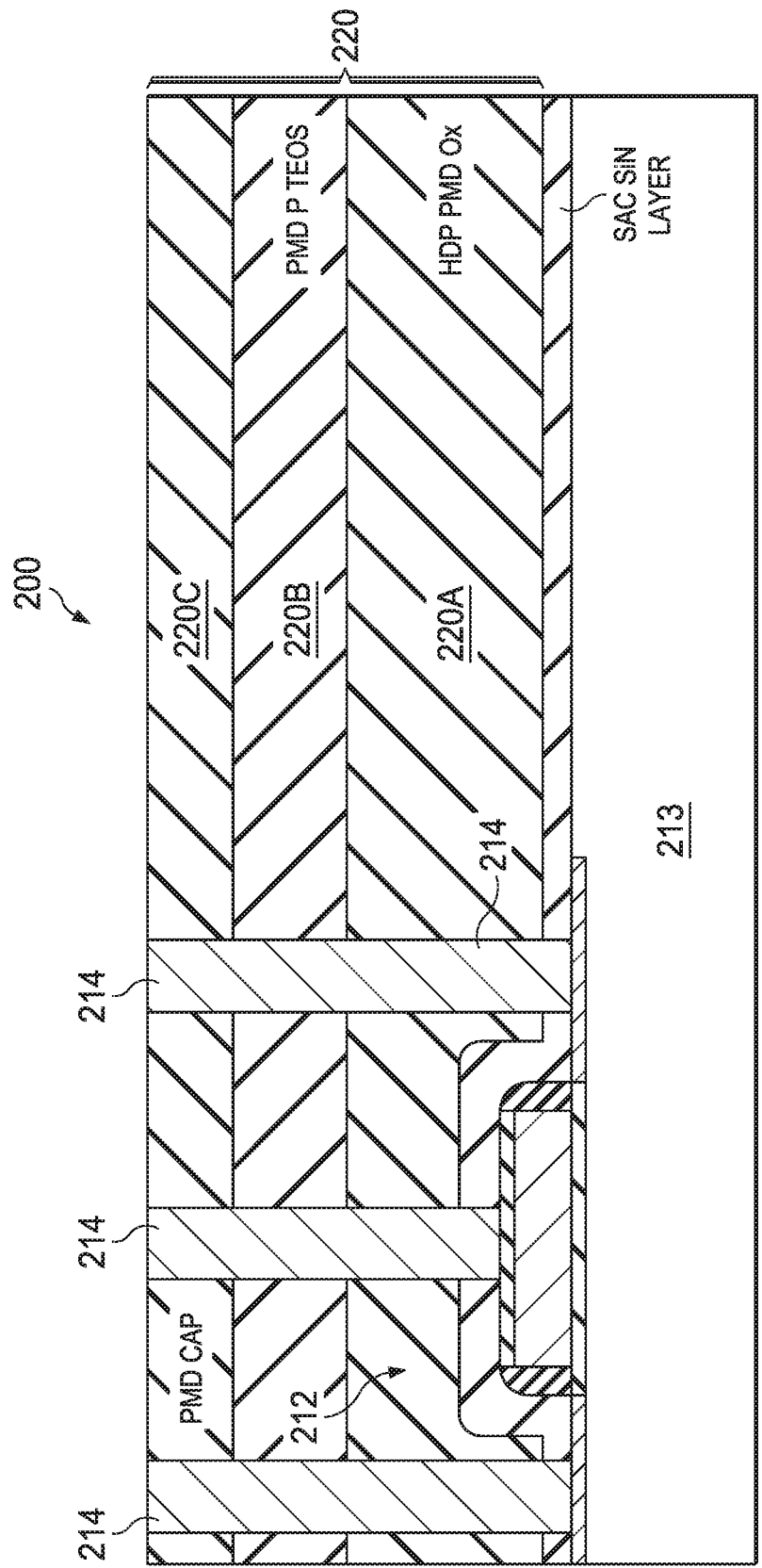
FIGS. 2A-2M illustrate steps of a second example method of integrating a thin film resistor (TFR) in a semiconductor integrated circuit (IC) device, according to a second example embodiment of the invention.

FIG. 2A illustrates an example integrated circuit (IC) structure 200, e.g., during the manufacturing of an IC device. In this example, the IC structure 200 includes a transistor structure 212 formed over a substrate 213, with a plurality of conductive contacts 214, e.g., tungsten vias, extending though a bulk insulation region 220 formed over the transistor structure 212. However, the IC structure 200 may include any other IC devices(s) or structure(s), e.g., one or more full or partial memory cells or memory cell structures, and conductive contacts associated with such structures. In this example embodiment, the bulk insulation region 220 includes (a) an HDP PMD oxide layer 220A, (b) a PMD oxide film 220B, e.g., PMD P TEOS, and (c) a PMD cap layer 220C.

FIG. 2A may represent a state during an IC fabrication process after formation of tungsten vias 214 and a wet chemical mechanical polish (W CMP) process at the top of the structure 200.

Figure 2B:
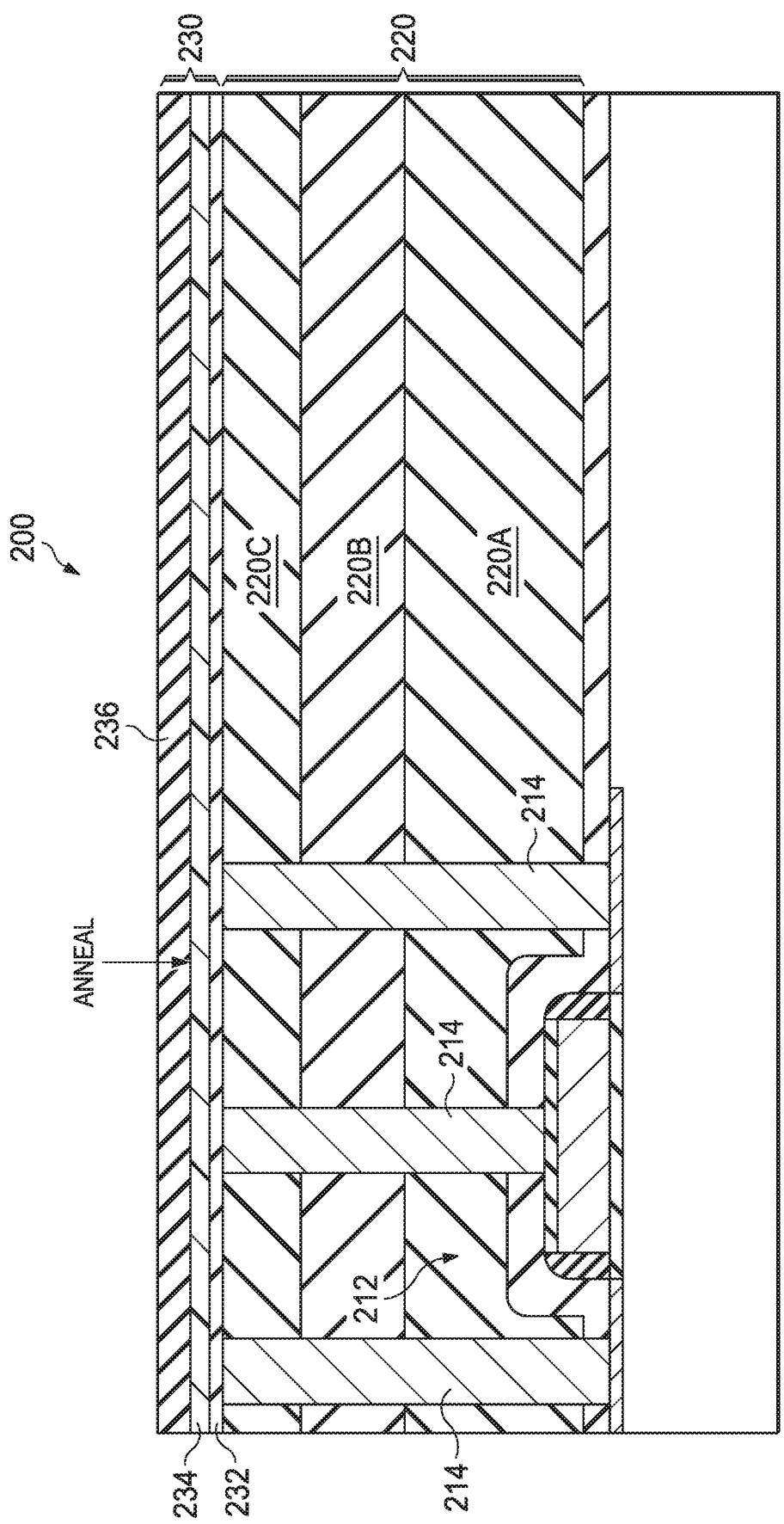

Next, as shown in FIG. 2B, a TFR layer stack 230 is formed over the bulk insulation region 220 and conductive contacts 214. First, a dielectric etch stop layer 232, e.g., a SiN layer, may be formed, e.g., to protect the tungsten vias 214 from a subsequent TFR etch shown below at FIG. 2E. A thin resistive film layer (TFR film layer) 234 may then be formed on the dielectric etch stop layer 232. The TFR film layer 234 may comprise, SiCCr, SiCr, TaN, TiN, or any other suitable TFR material.

In some embodiments, e.g., the example embodiment shown in FIGS. 2A-2M, a TFR anneal may be performed at this point, e.g., to tune or optimize a temperature coefficient of resistance (TCR) of the TFR film layer 234. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 260 (e.g., "Metal 1" layer) discussed below with reference to FIG. 2K. For example, in some embodiments, the TFR anneal may be performed after forming the TFR hardmask cap layer 236 discussed below. In other embodiments, the TFR anneal may be performed after etching to define the TFR element 234A discussed below with respect to FIG. 2E. In other embodiments, the TFR anneal may be performed after completing the TFR contact etch and removing the photoresist as described below with respect to FIGS. 2H-2I.

After the TFR anneal shown in FIG. 2B, a TFR hardmask cap layer 236 may be formed on the TFR film layer 234. In this embodiment, the TFR hardmask cap layer 236 comprises a SiN layer.

Figure 2C:
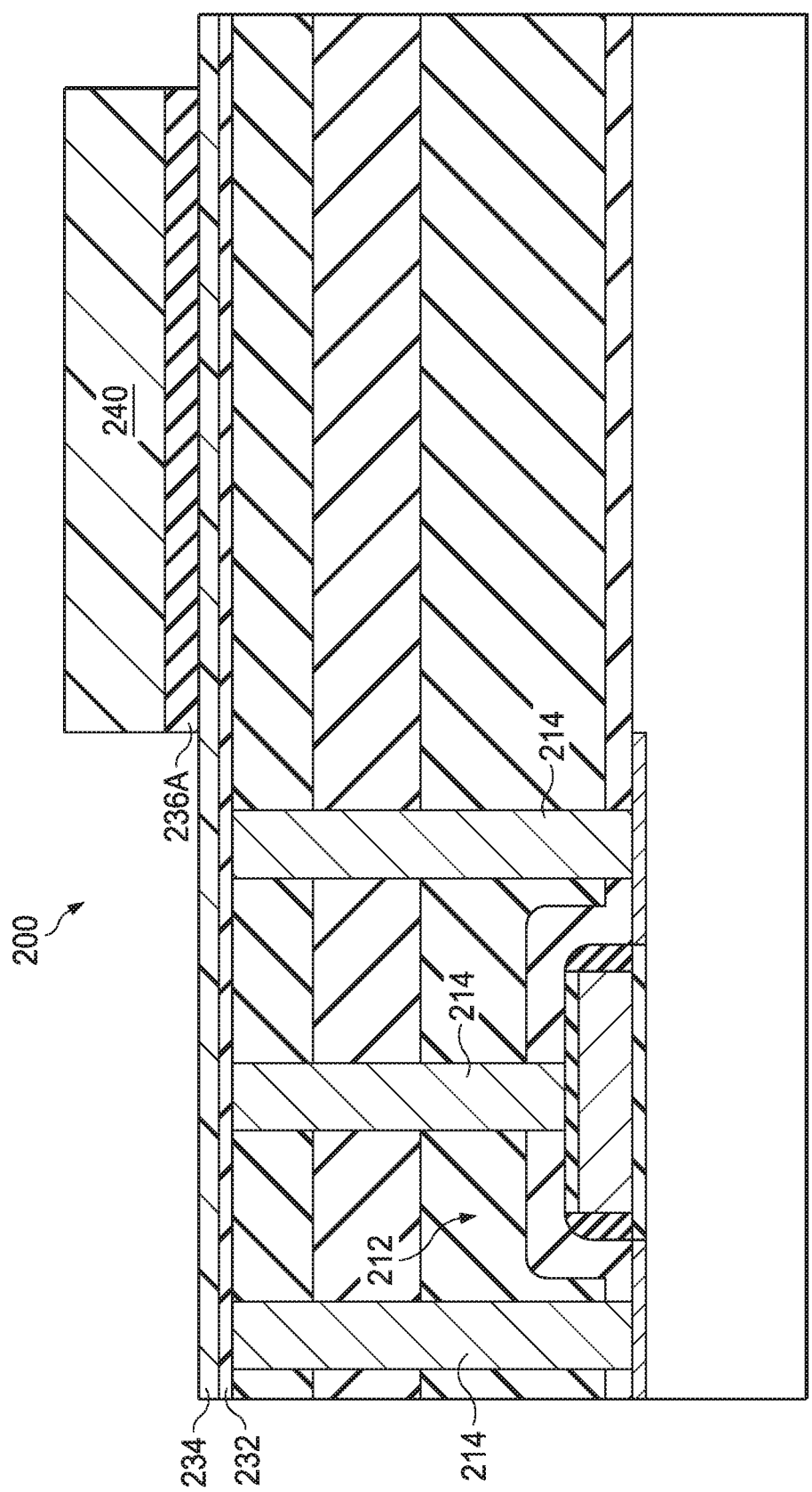

As shown in FIG. 2C, a first photomask 240 may be formed and patterned on the TFR hardmask cap layer 236 of FIG. 2B (e.g., using known photolithographic techniques), in this example at a location laterally offset from the underlying transistor structure 212. An etch (e.g., a dry etch) may then be performed to remove exposed portions of the TFR hardmask cap layer 236 of FIG. 2B, and stopping on the TFR film layer 234, to thereby define a TFR hardmask cap 236A.

Figure 2D:
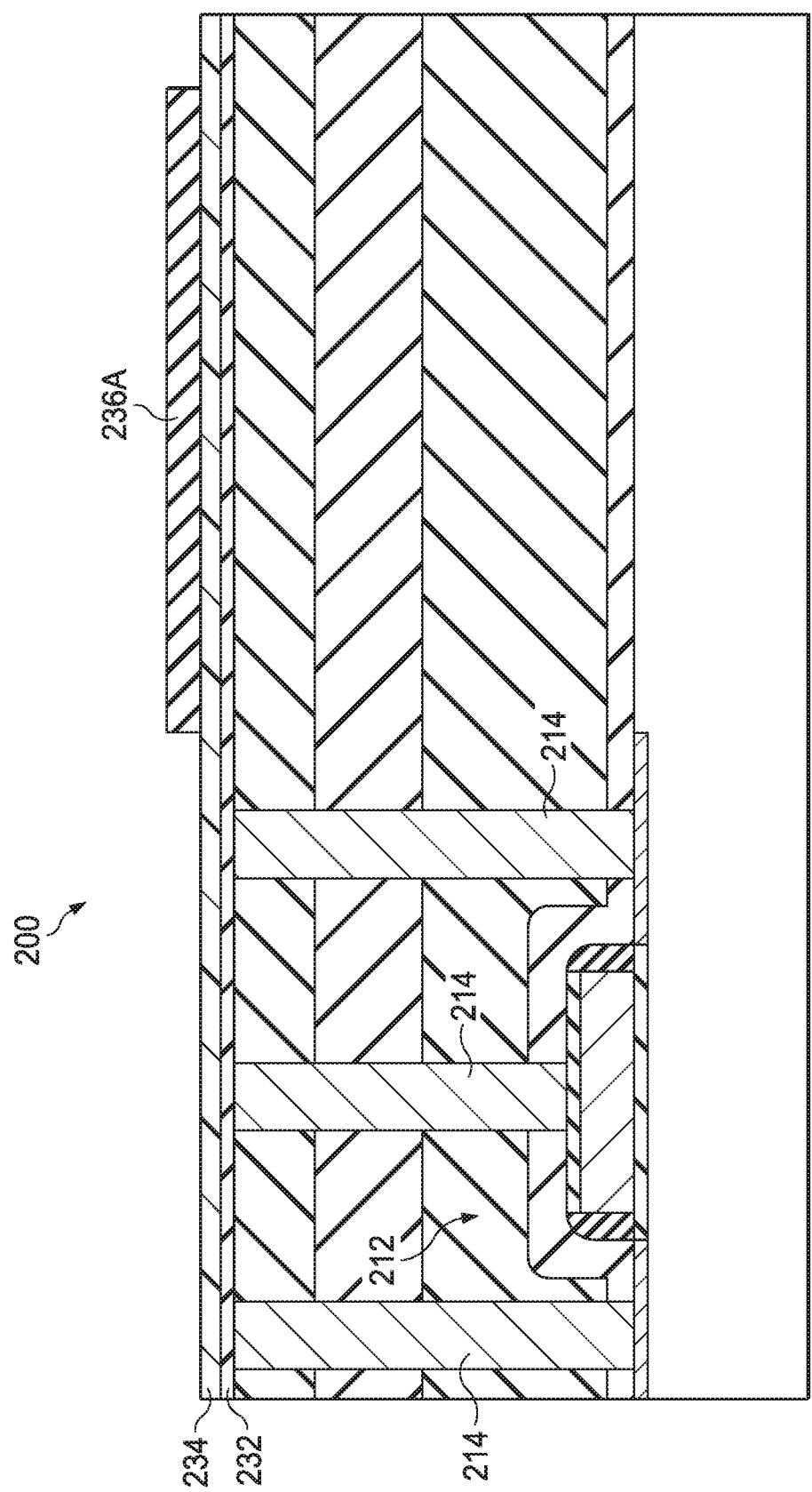

As shown in FIG. 2D, remaining portions of the photoresist 240 of FIG. 2C may be stripped. In some embodiments, a chemical clean may be used because the underlying tungsten contacts 214 are protected by the TFR film layer 234 and underlying dielectric etch stop layer 232.

Figure 2E:
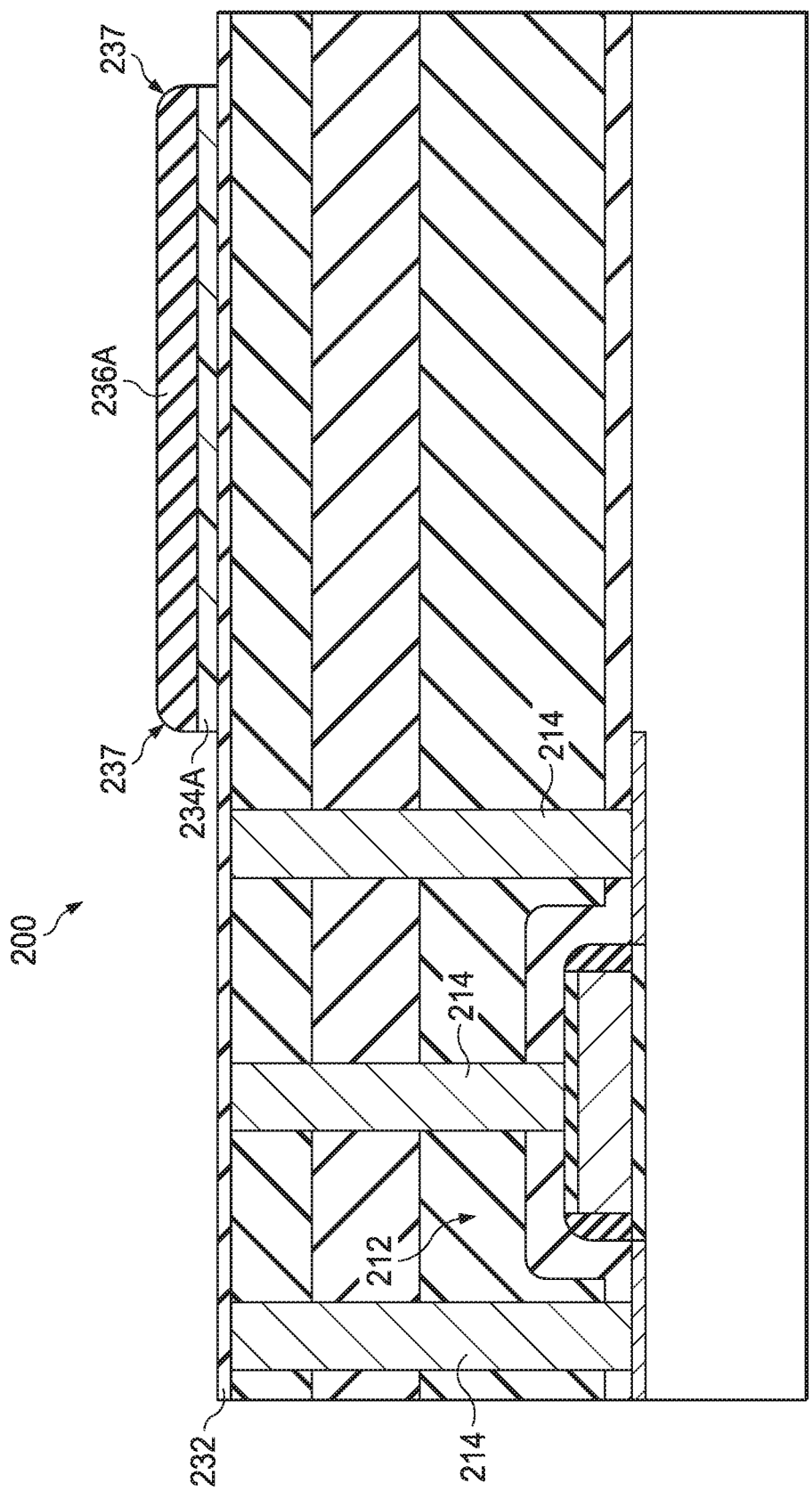

As shown in FIG. 2E, a TFR etch (e.g., a dry etch) may be performed, using the TFR hardmask cap 236A as a hardmask, to remove exposed portions of the TFR film layer 234, to thereby define a TFR element 234A. As shown, the TFR film etch may round the exposed upper corners 237 of the TFR hardmask cap 236A, and may stop on the dielectric etch stop layer 232 to protect the underlying structures, e.g., tungsten contacts 214. Using the TFR hardmask cap 236A as a hardmask for the TFR etch avoids the need to use a photomask for this etch, which may eliminate the formation of polymer residue from the photomask and thus the typical problems associated with removing such polymer residue.

Figure 2F:
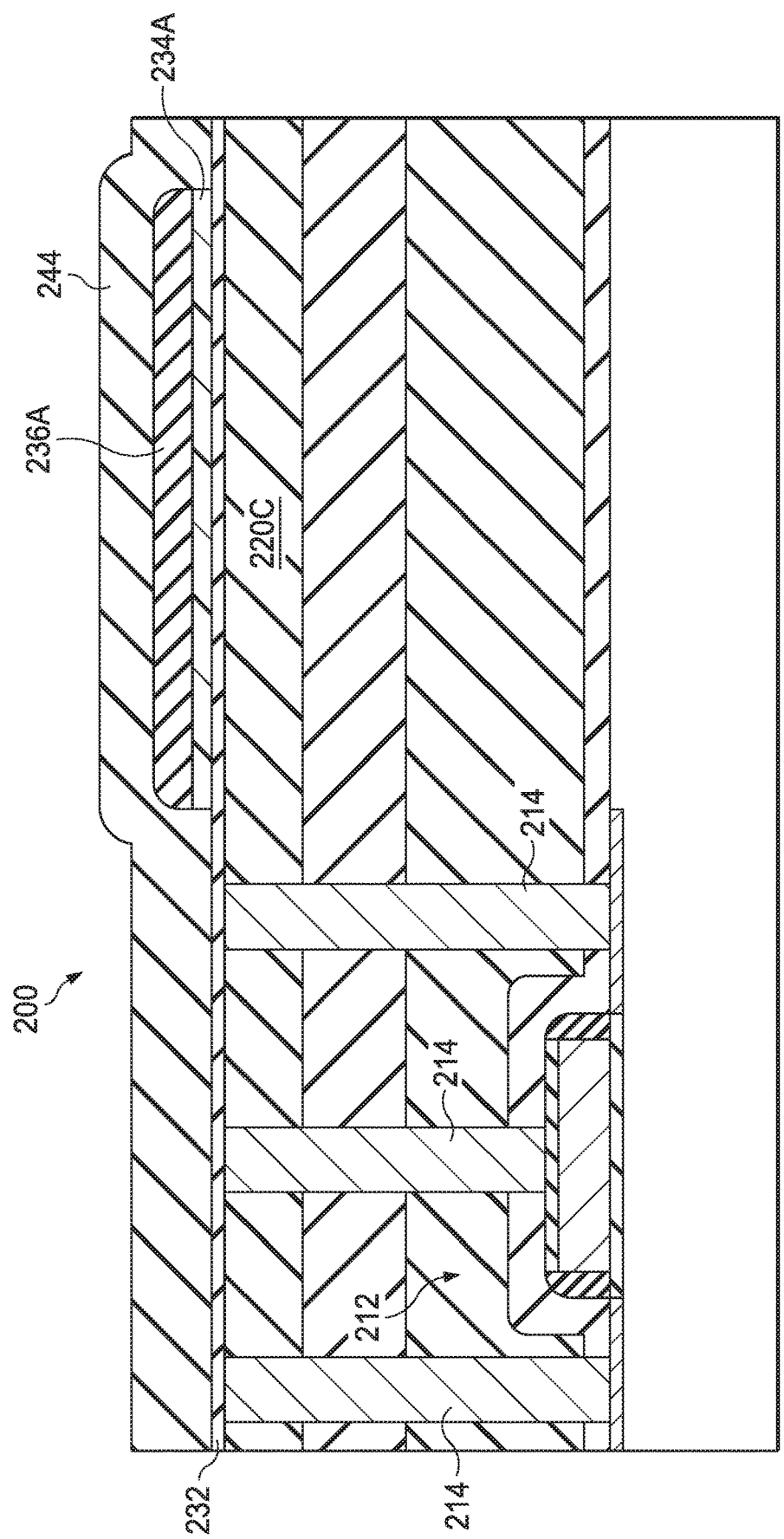

As shown in FIG. 2F, an oxide cap layer 244 is then formed over the structure. In some embodiments, the oxide cap layer 244 may comprise the same material as the PMD cap layer 220C below the dielectric etch stop layer 232. The oxide cap layer 244 may have a reduced thickness as compared with the PMD cap layer 220C, but sufficiently thick to stop a subsequent metal etch (e.g., the Metal 1 layer etch shown in FIG. 2M).

Figure 2G:
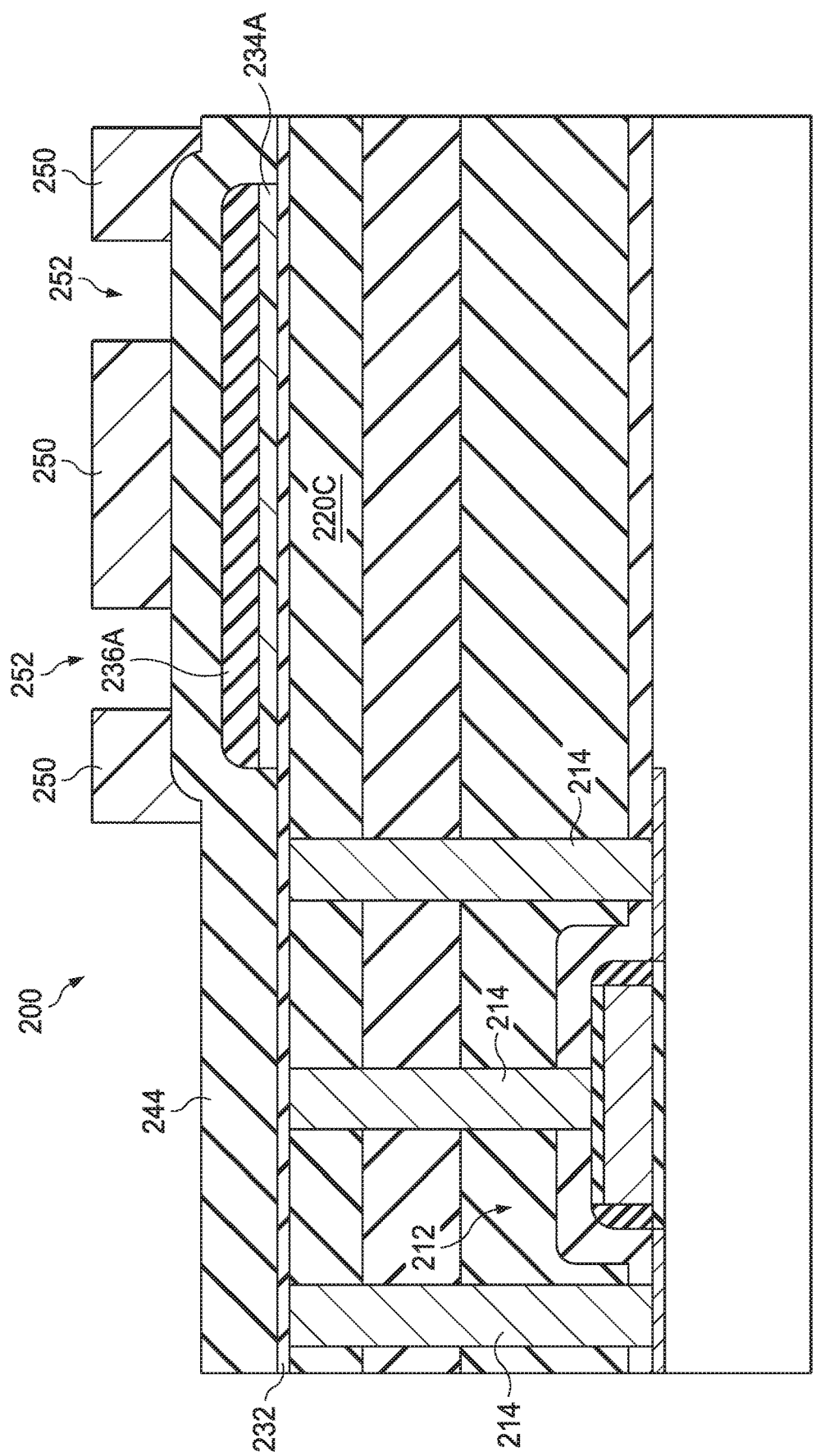

As shown in FIG. 2G, a second photomask 250 is formed on the oxide cap layer 244 and patterned over selected areas of the TFR element 234A to define mask openings 252 aligned over the TFR element 234A.

Figure 2H:
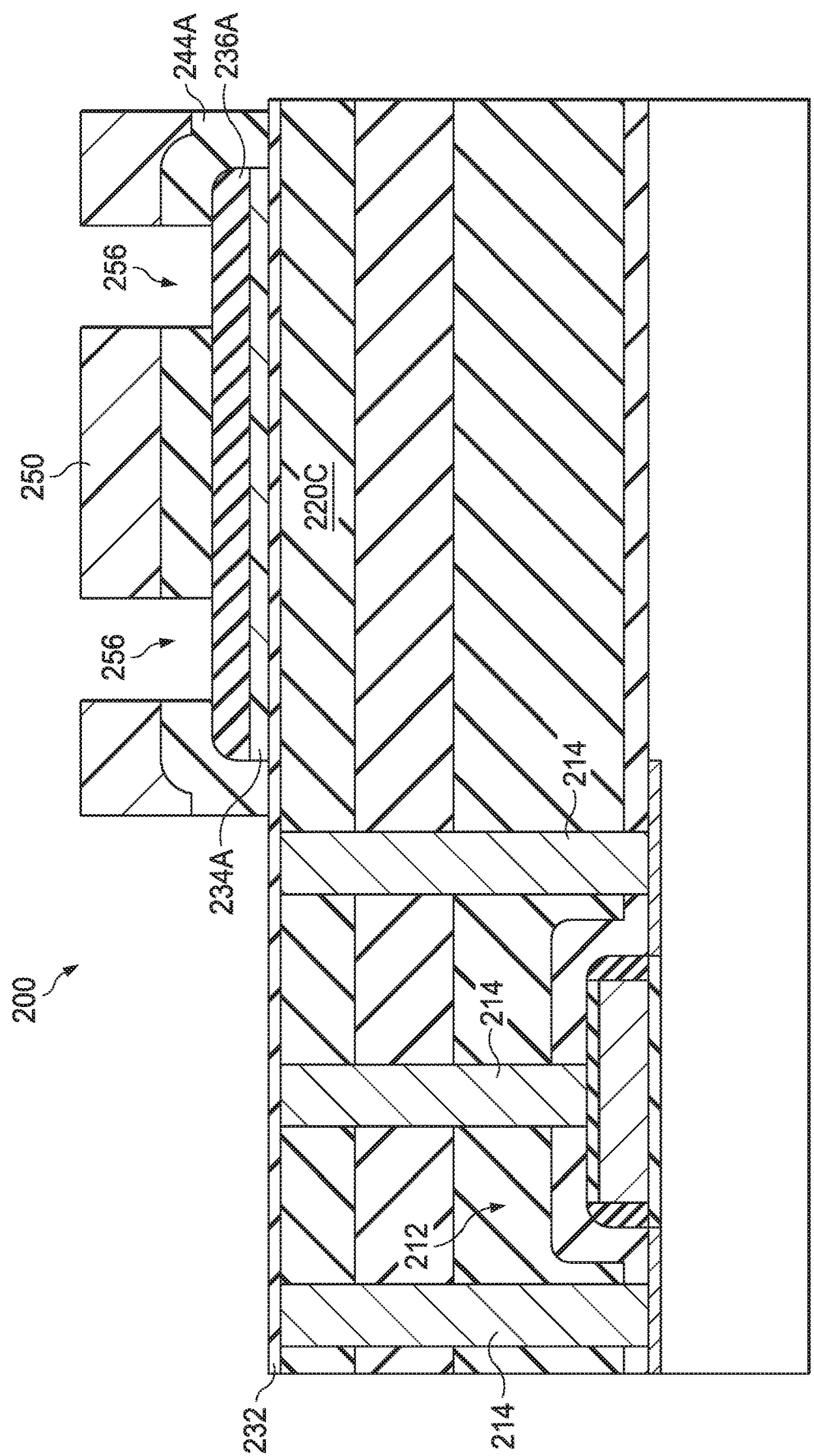

As shown in FIG. 2H, a first TFR contact etch is performed to (a) remove selected portions of the oxide cap layer 244 to define an oxide cap 244A having oxide cap openings 256. The first TFR contact etch may stop on the dielectric etch stop layer 232 at areas outside the outer perimeter of the photomask 250, and may stop on the TFR hardmask cap 236A at the bottom of the oxide cap openings 256 within the outer perimeter of the photomask 250.

The first TFR contact etch may be a wet etch or a dry etch. A wet etch may improve the flow of metal during a subsequent metal deposition (e.g., the Metal 1 layer deposition shown in FIG. 2K), and may reduce the occurrence of electrical shorts (often referred to as "stringers") along the TFR element 234A and between adjacent metal structures (e.g., Metal 1 layer structures).

Figure 2I:
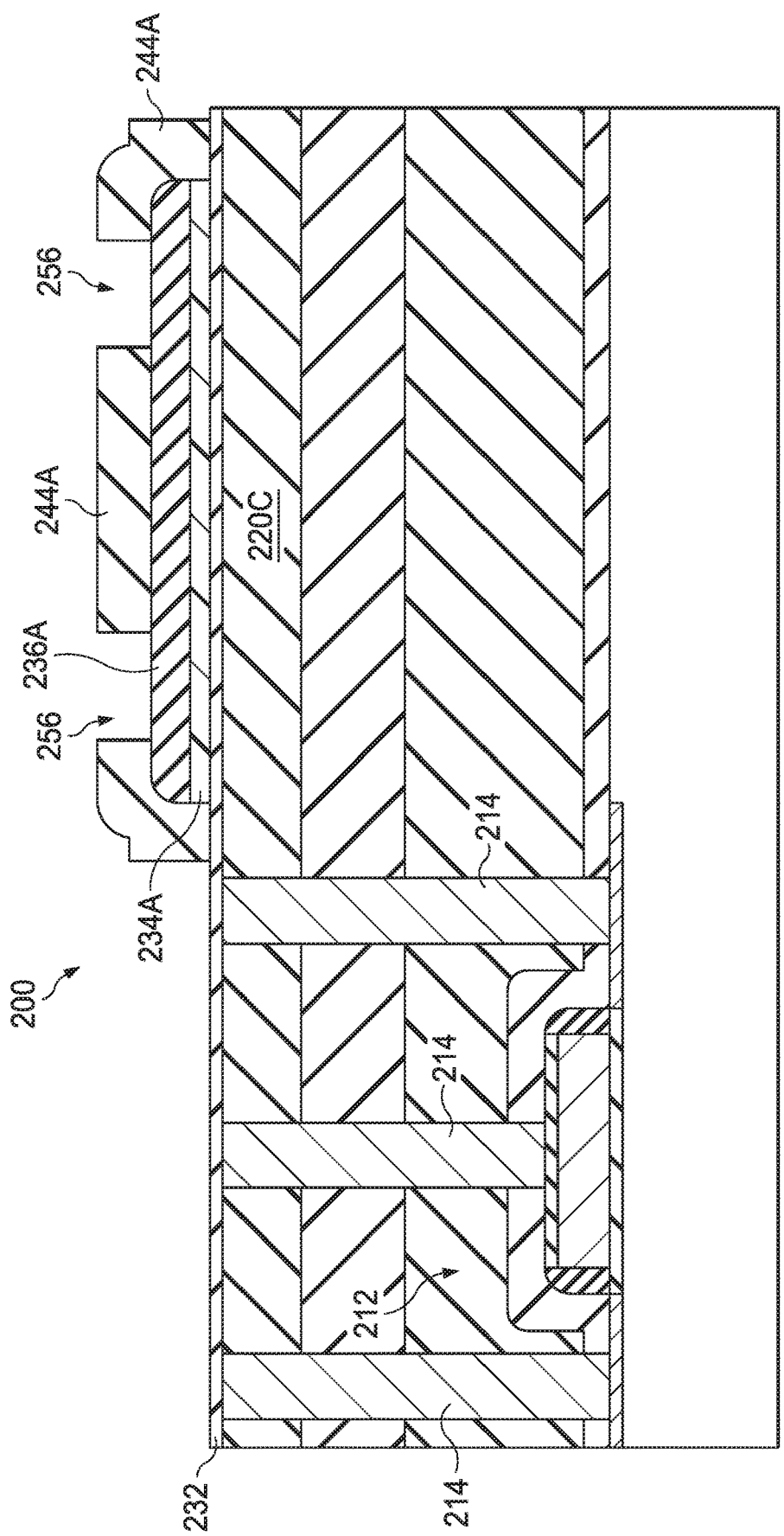

As shown in FIG. 2I, remaining portions of the second photomask 250 of FIG. 2H may be removed, e.g., by a resist strip. In some embodiments, a chemical clean may be used to remove remaining portions of the second photomask 250 of FIG. 2H because underlying IC structures, e.g., the tungsten vias 214, are protected by the dielectric etch stop layer 232.

Figure 2J:
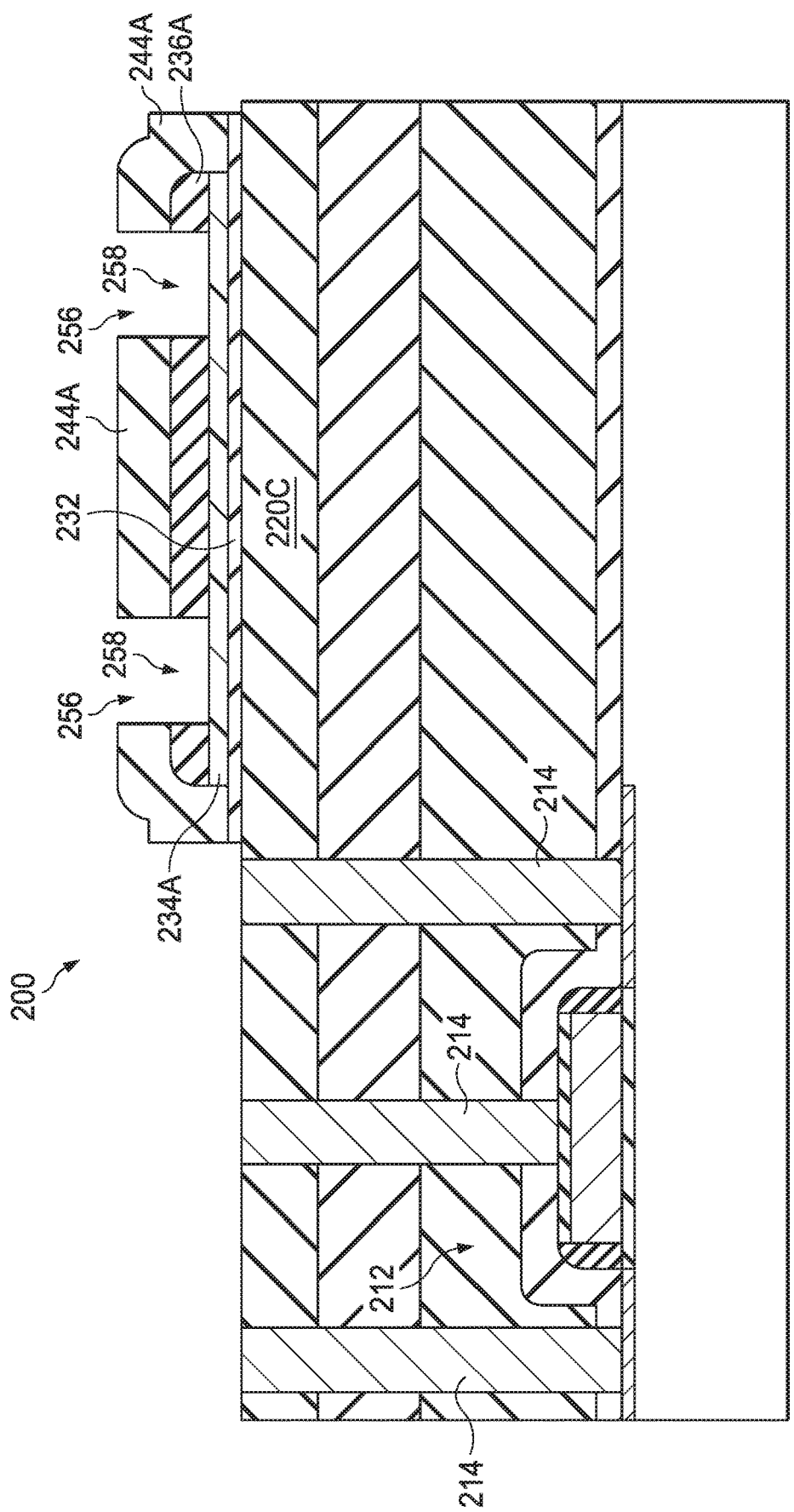

As shown in FIG. 2J, a second TFR contact etch may be performed to (a) remove portions of the TFR hardmask cap 236A exposed through the oxide cap openings 256 in the oxide cap 244A to define TFR contact openings 258 that expose a top surface of the TFR element 234A and (b) remove portions of the dielectric etch stop layer 232 exposed outside the perimeter of the oxide cap 244A, which may expose a top surface of the PMD cap layer 220C and the underlying tungsten contacts 214. In an embodiment in which dielectric etch stop layer 232 comprises a SiN layer, the second TFR contact etch may comprise a gentle SiN clear etch with high selectivity to oxide, to protect the underlying tungsten contacts 214.

Figure 2K:
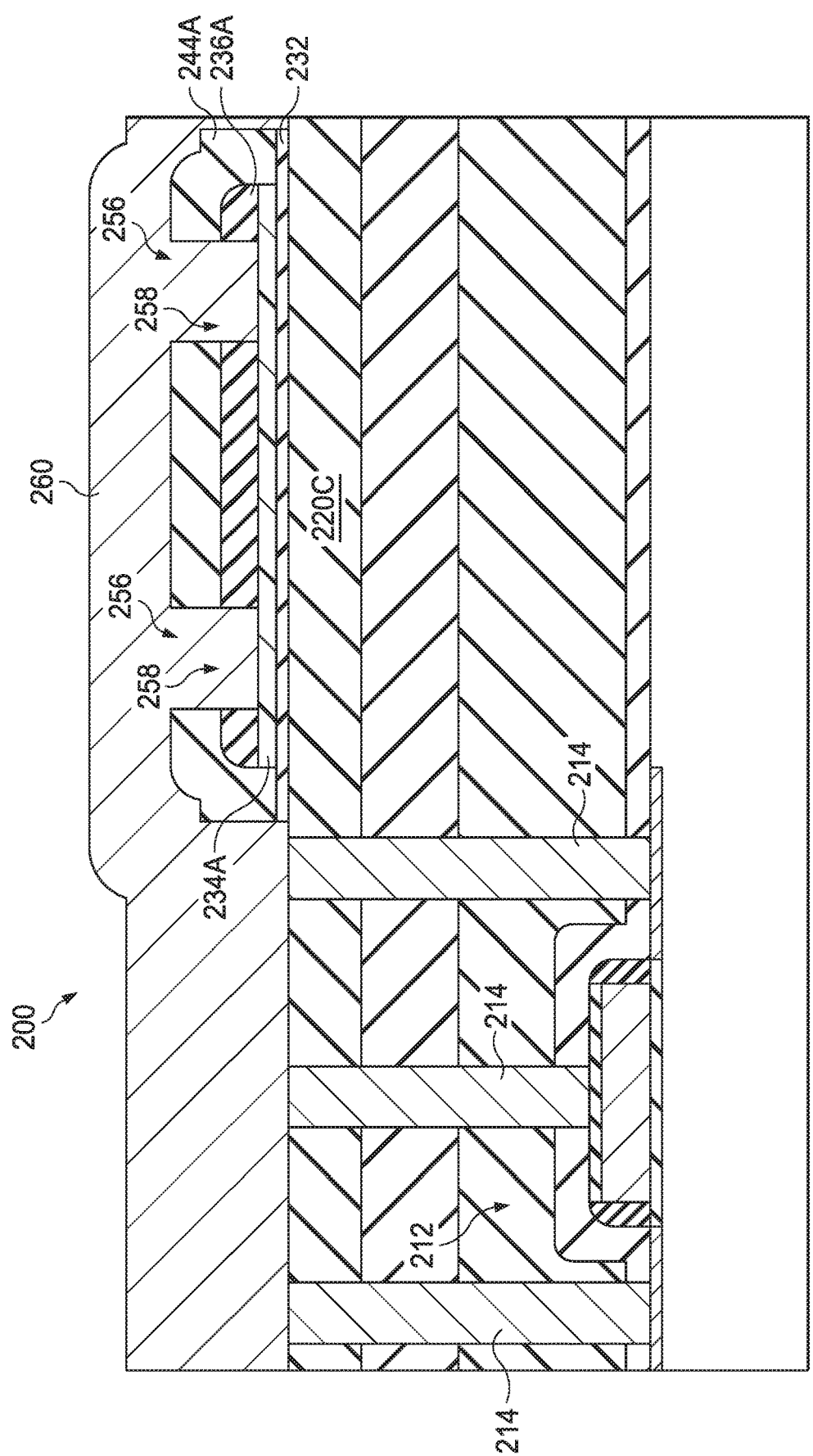

As shown in FIG. 2K, the IC device processing may continue, by forming a first metal layer/interconnect layer, referred to as a "Metal 1" layer 260. In the illustrated embodiment, Metal 1 layer 260 comprises aluminum. In other embodiments, Metal 1 layer 260 may comprise copper or other metal. As shown, Metal 1 layer 260 extends into the oxide cap openings 256 and TFR contact openings 258, to thereby contact the TFR element 234A at disparate contact locations of the TFR element 234A. Metal 1 layer 260 also extends over and in contact with tungsten contacts 214.

Figure 2L:
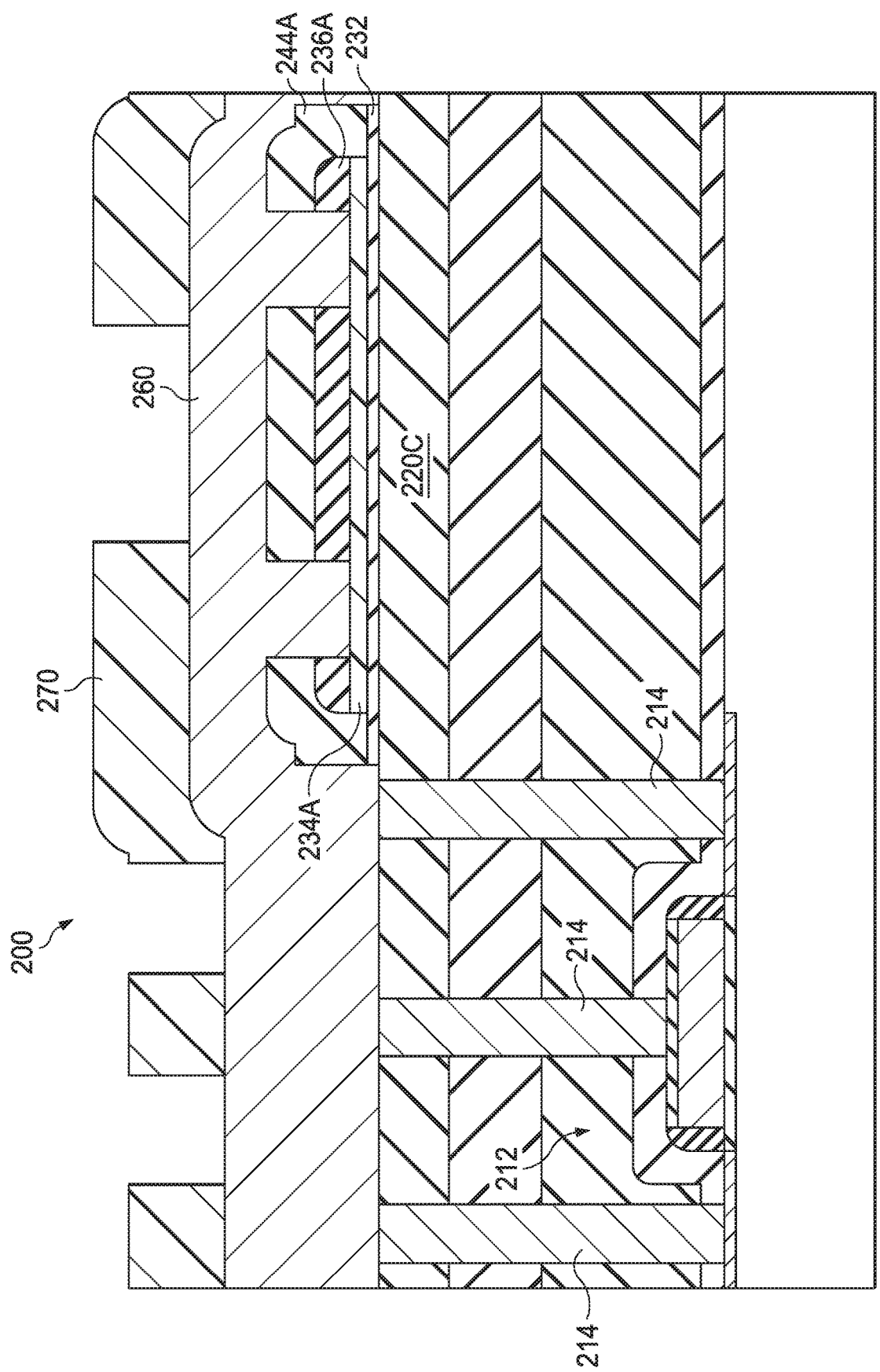

Next, as shown in FIG. 2L, a third photomask 270 may be formed and patterned over the Metal 1 layer.

Figure 2M:
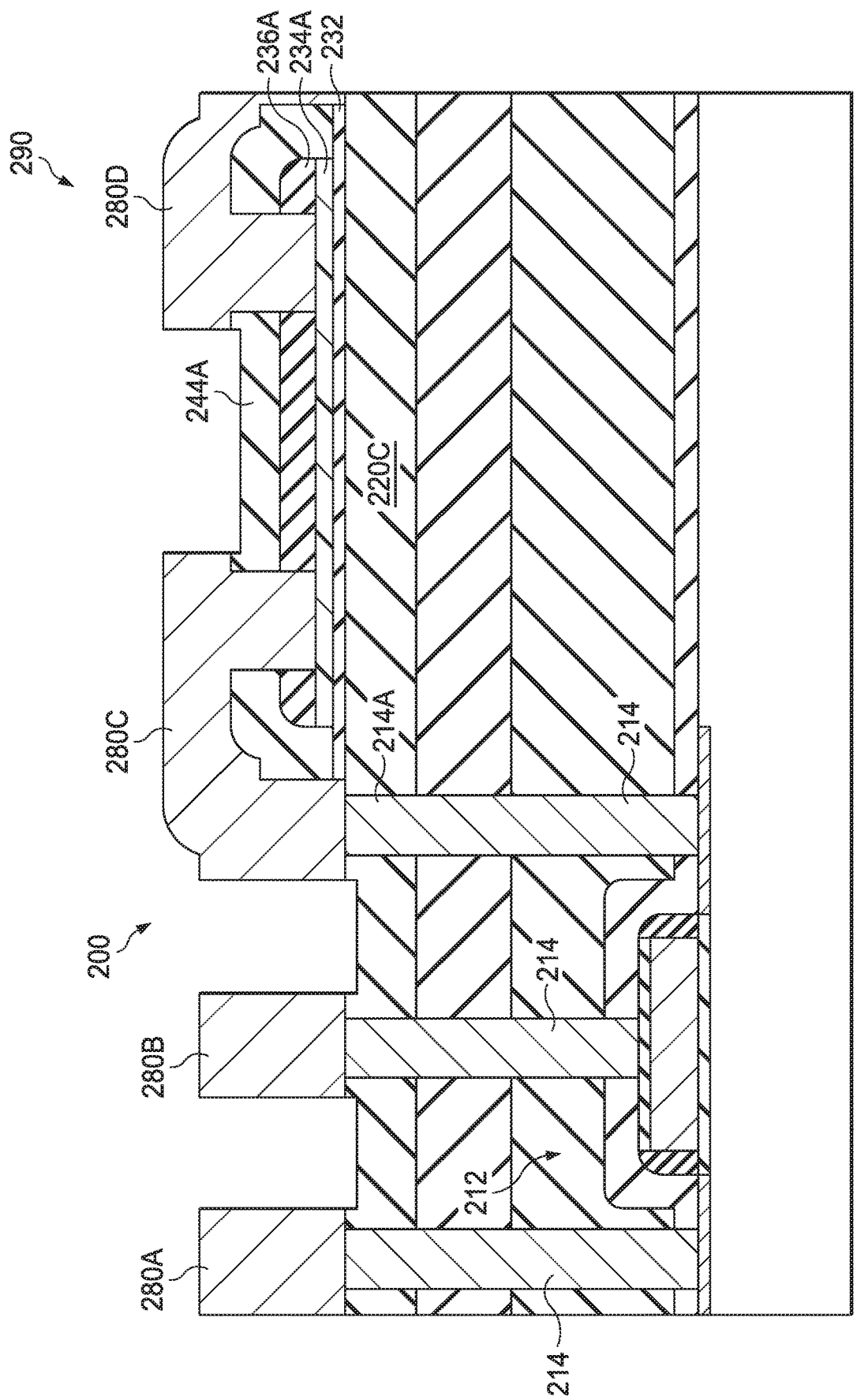

Finally, as shown in FIG. 2M, the aluminum Metal 1 layer 260 may be etched using the third photomask 270 to define a plurality of aluminum Metal 1 elements (e.g., metal interconnect elements) 280A-280D, and the remaining photoresist material 270 may then be removed. For example, as shown, the Metal 1 layer may be etched to define aluminum interconnect elements 280A and 280B in contact with tungsten vias 214, and aluminum interconnect elements 280C and 280D in contact with the disparate contact locations of the TFR element 234A. In this example illustration, a first aluminum interconnect element 280C conductively connects a first contact location of the TFR element 234A with a tungsten via 214A coupled to a source or drain region of the transistor 212, and a second interconnect element 280D conductively contacts a second contact location of the TFR element 234A with other IC element structure(s) (not shown). The TFR element 234A and the first and second interconnect elements 280C and 280D collectively define an integrated TFR, indicated at 290.

As discussed below, e.g., with respect to FIGS. 4A-4C and 5A-5C, the rounded upper corners 237 of the TFR hardmask cap 236A may facilitate the removal of selected portions of the Metal 1 layer 260 adjacent selected lateral edges of the TFR element 234A, e.g., to further prevent electrical shorts ("stringers") in the completed device.

FIGS. 3A-3K illustrate an example method of integrating a thin film resistor (TFR) in a semiconductor integrated circuit (IC) device, according to one example embodiment.

Figure 3A:
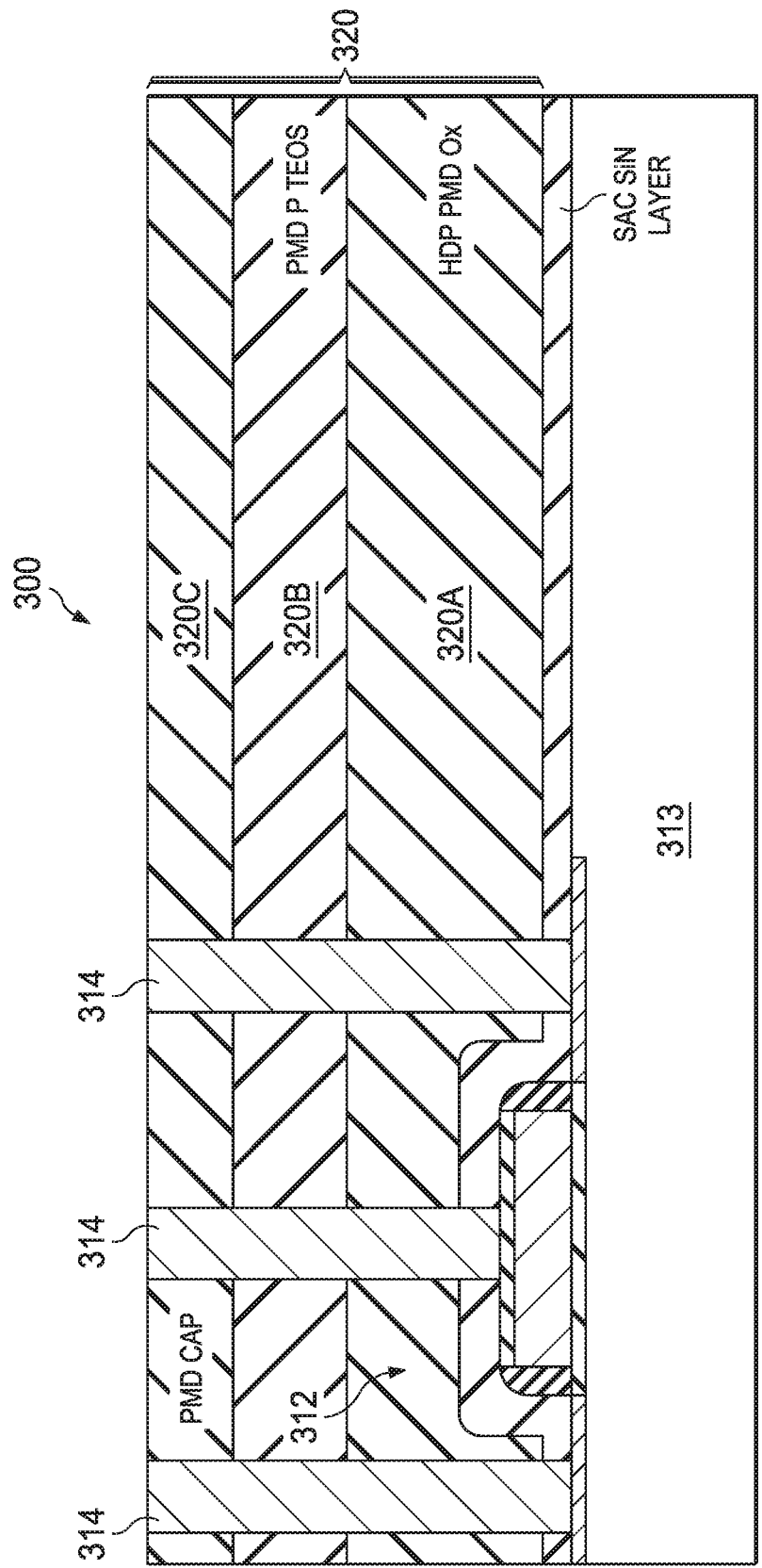
FIGS. 3A-3K illustrate steps of a third example method of integrating a thin film resistor (TFR) in a semiconductor integrated circuit (IC) device, according to a third example embodiment of the invention.

FIG. 3A illustrates an example integrated circuit (IC) structure 300, e.g., during the manufacturing of an IC device. In this example, the IC structure 300 includes a transistor structure 312 formed over a substrate 313, with a plurality of conductive contacts 314, e.g., tungsten vias, extending though a bulk insulation region 320 formed over the transistor structure 312. However, the IC structure 300 may include any other IC devices(s) or structure(s), e.g., one or more full or partial memory cells or memory cell structures, and conductive contacts associated with such structures. In this example embodiment, the bulk insulation region 320 includes (a) an HDP PMD oxide layer 320A, (b) a PMD oxide film 320B, e.g., PMD P TEOS, and (c) a PMD cap layer 320C.

FIG. 3A may represent a state during an IC fabrication process after formation of tungsten vias 314 and a wet chemical mechanical polish (W CMP) process at the top of the structure 300.

Figure 3B:
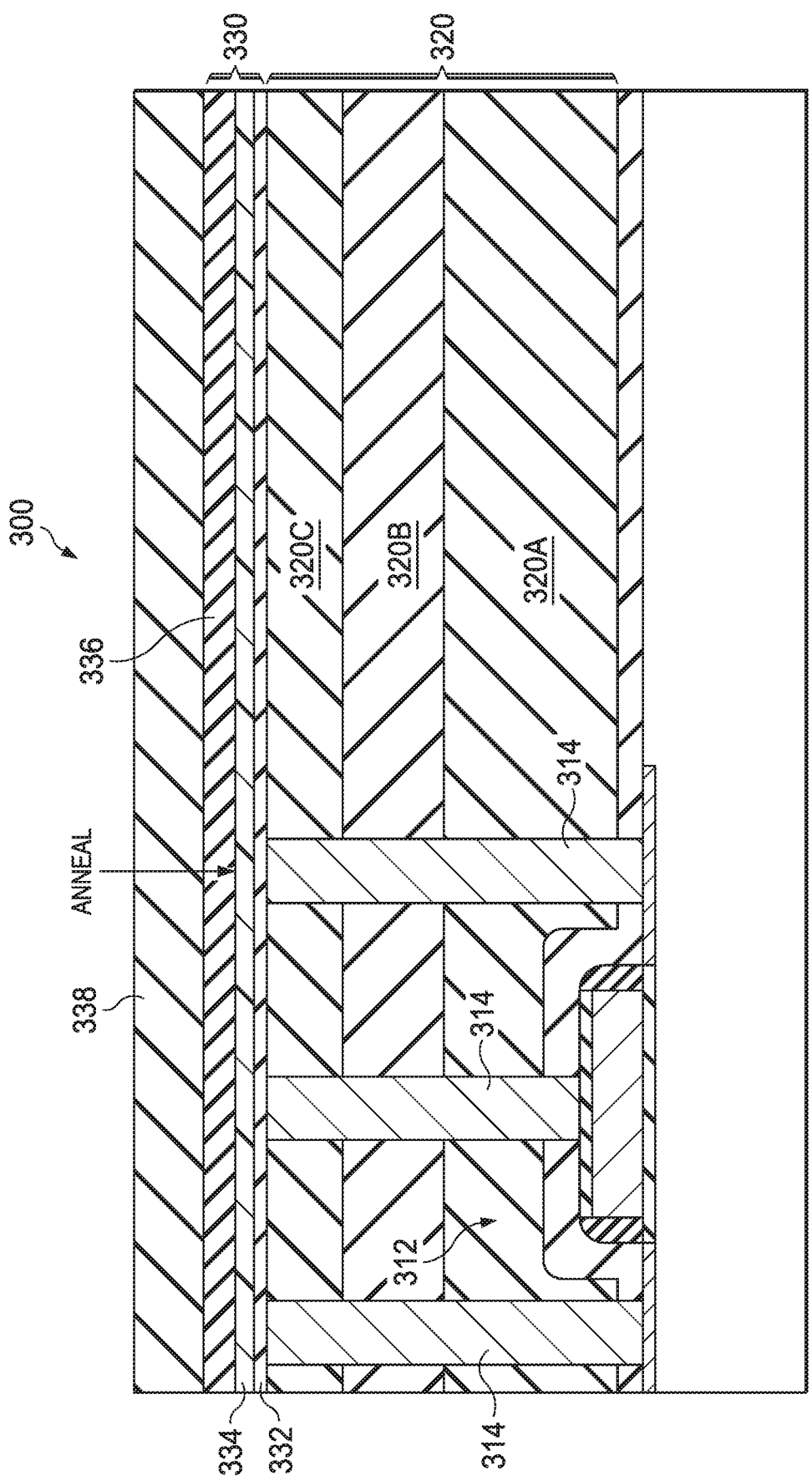

Next, as shown in FIG. 3B, a TFR layer stack 330 is formed over the bulk insulation region 320 and conductive contacts 314. First, a dielectric etch stop layer 332, e.g., a SiN layer, may be formed, e.g., to protect the tungsten vias 314 from a subsequent TFR etch shown below at FIG. 3E. A thin resistive film layer (TFR film layer) 334 may then be formed on the dielectric etch stop layer 332. The TFR film layer 334 may comprise, SiCCr, SiCr, TaN, TiN, or any other suitable TFR material.

In some embodiments, e.g., the example embodiment shown in FIGS. 3A-3K, a TFR anneal may be performed at this point, e.g., to tune or optimize a temperature coefficient of resistance (TCR) of the TFR film layer 334. For example, an anneal may be performed at a temperature of ≥500° C. In some embodiments, the TFR anneal may comprise an anneal at 515° C.±10° C. for a duration of 15-60 minutes, e.g., 30 min. In other embodiments, the TFR anneal may be performed at any other point in the process, prior to the deposition of the first metal layer/interconnect layer 360 (e.g., "Metal 1" layer) discussed below with reference to FIG. 3I. For example, in some embodiments, the TFR anneal may be performed after forming the etch stop layer 336 discussed below. In other embodiments, the TFR anneal may be performed after etching to define the TFR element 334A discussed below with respect to FIG. 3E. In other embodiments, the TFR anneal may be performed after completing the TFR contact etch described below with respect to FIG. 3H.

Figure 3C:
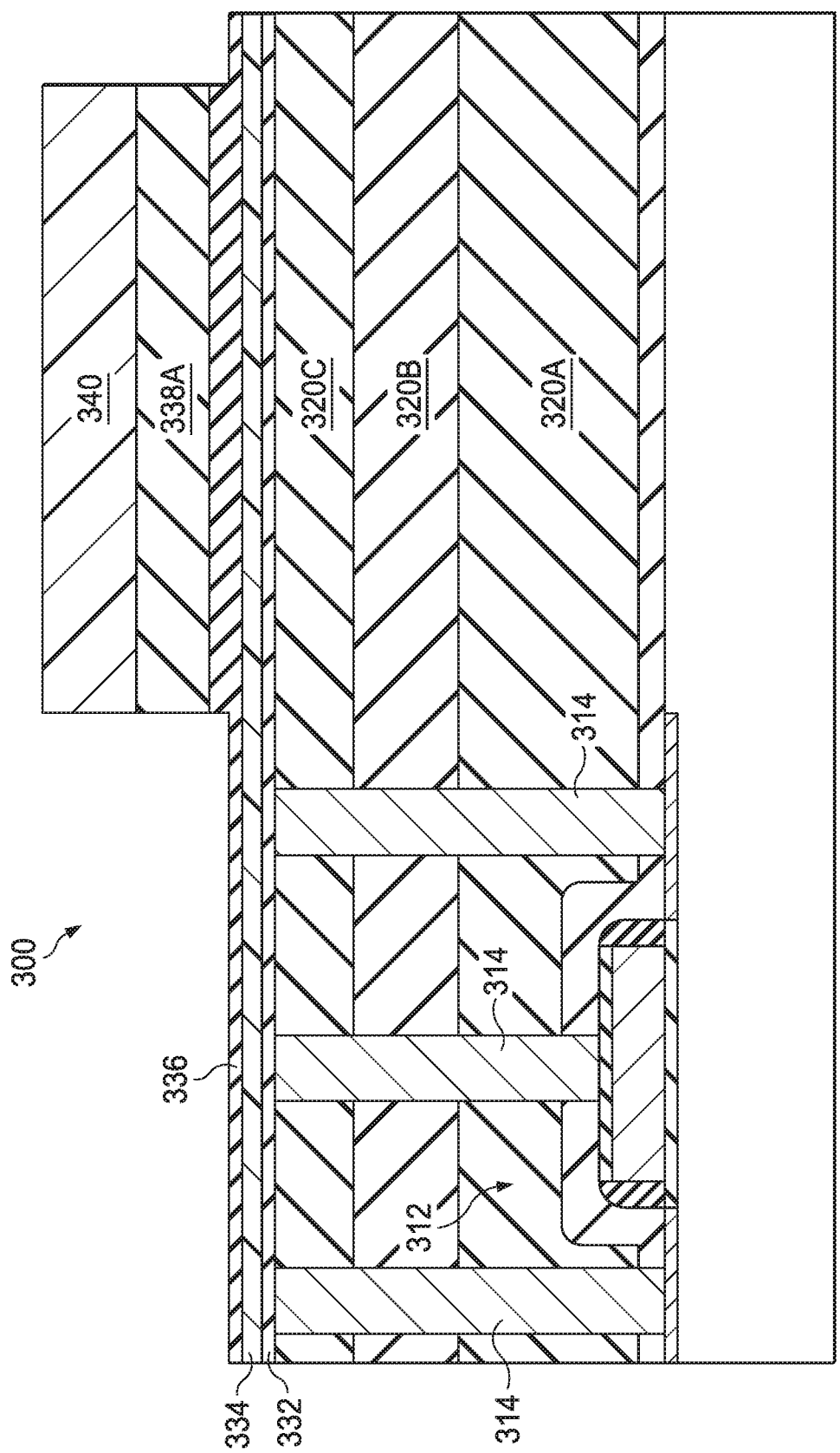

After the TFR anneal shown in FIG. 3C, an etch stop layer 336 may be formed on the TFR film layer 334. In this embodiment, the etch stop layer 336 comprises a SiN layer. A oxide cap layer 338 may then be formed on the etch stop layer 336.

As shown in FIG. 3C, a first photomask 340 may be formed and patterned on the oxide cap layer 338 of FIG. 3B (e.g., using known photolithographic techniques), in this example at a location laterally offset from the underlying transistor structure 312. An etch (e.g., a dry etch) may then be performed to remove exposed portions of the oxide cap layer 338, and stopping at the etch stop layer 336, to thereby define an oxide cap 338A.

Figure 3D:
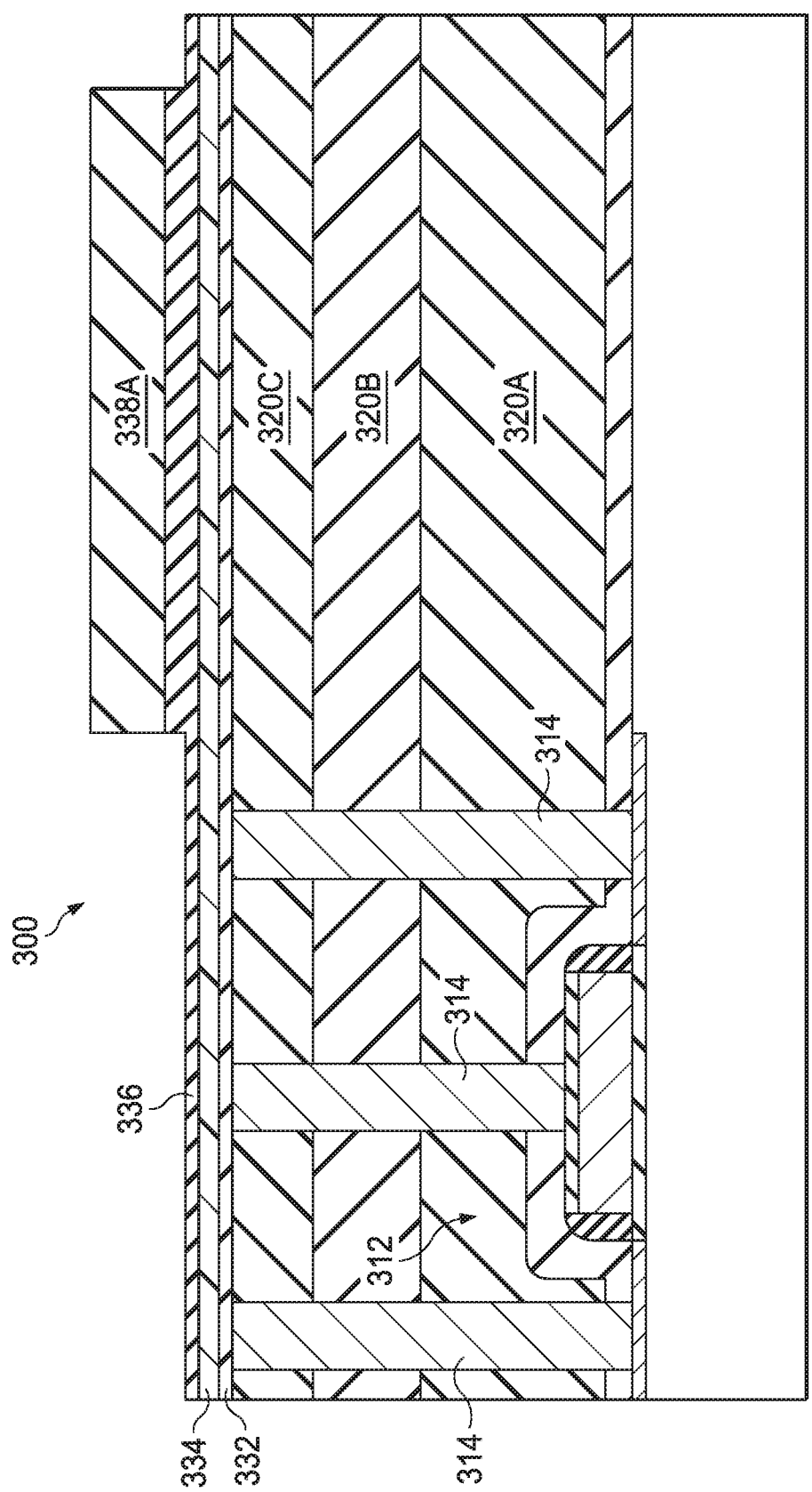

As shown in FIG. 3D, remaining portions of the photoresist 340 of FIG. 3C may be stripped, e.g., using a chemical clean process.

Figure 3E:
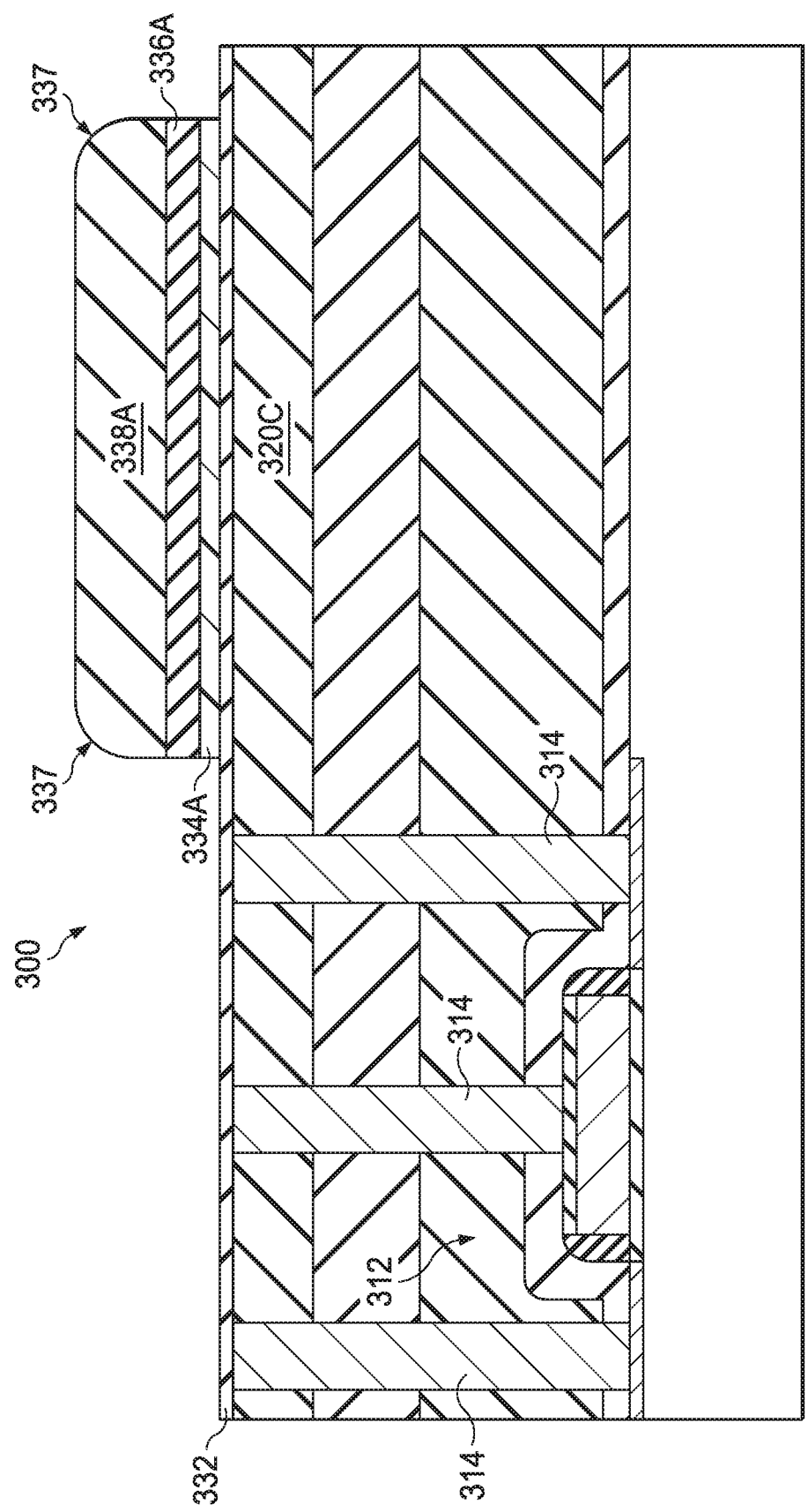

As shown in FIG. 3E, a TFR etch (e.g., a dry etch) may be performed, using the oxide cap 338A as a hardmask, to remove exposed portions of the etch stop layer 336 and underlying TFR film layer 334, to thereby define an etch stop cap 336A and a TFR element 334A underneath the etch stop cap 336A. As shown, the TFR etch may round the exposed upper corners 337 of the oxide cap 338A, and may stop on the dielectric etch stop layer 332 to protect the underlying structures, e.g., tungsten contacts 314. Using the oxide cap 338A as a hardmask for the TFR etch avoids the need to use a photomask for this etch, which may eliminate the formation of polymer residue from the photomask and thus the typical problems associated with removing such polymer residue.

Figure 3F:
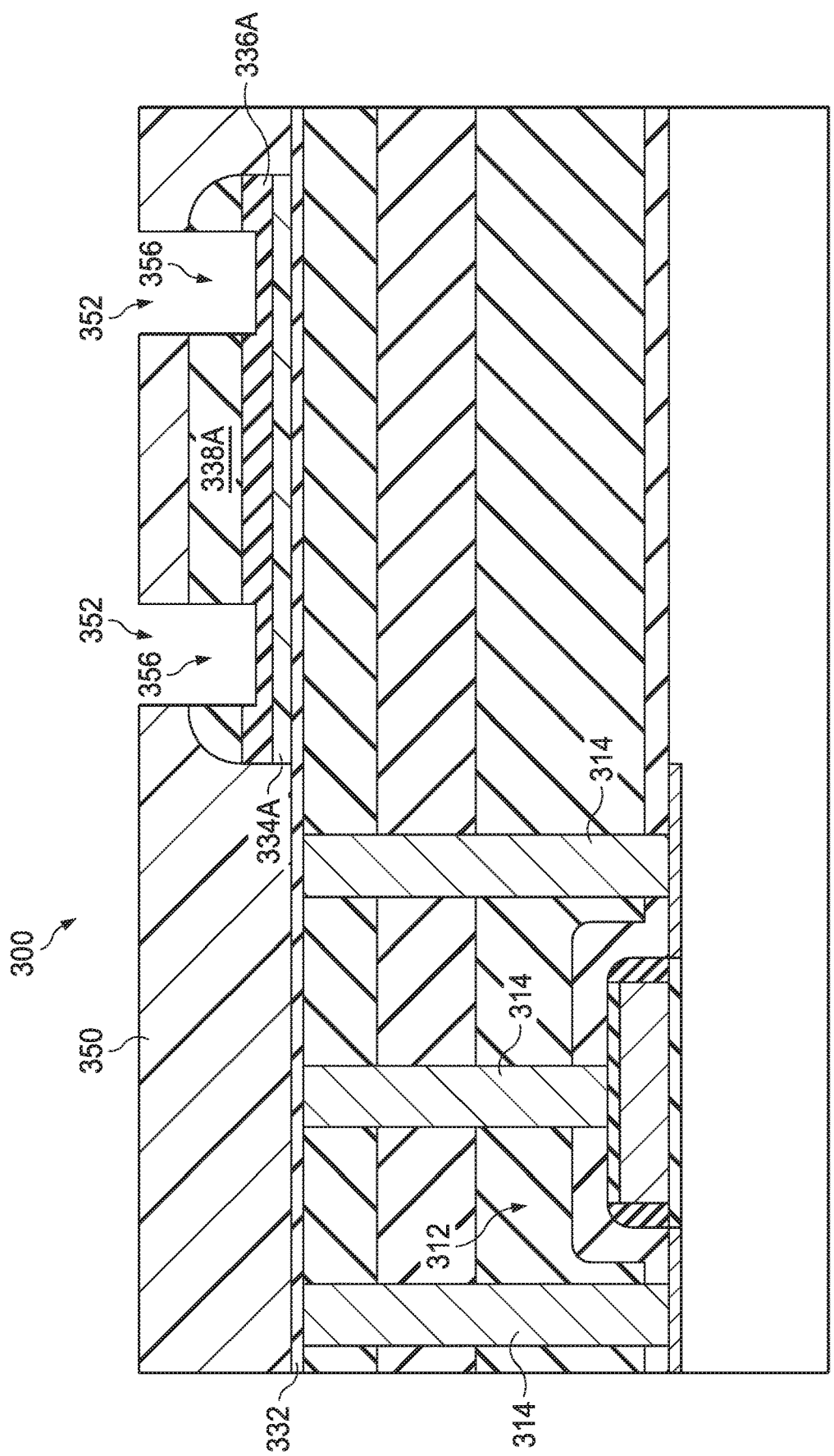

As shown in FIG. 3F, a second photomask 350 is formed over the structure and patterned to define mask openings 352 aligned over the TFR element 334A. A first TFR contact etch is performed to define oxide cap openings 356 in the oxide cap 338A, stopping at the etch stop cap 336A. The first TFR contact etch may be a wet etch or a dry etch. A wet etch may improve the flow of metal during a subsequent metal deposition (e.g., the Metal 1 layer deposition shown in FIG. 3I), and may reduce the occurrence of electrical shorts (often referred to as "stringers") along the TFR element 334A and between adjacent metal structures (e.g., Metal 1 layer structures).

Figure 3G:
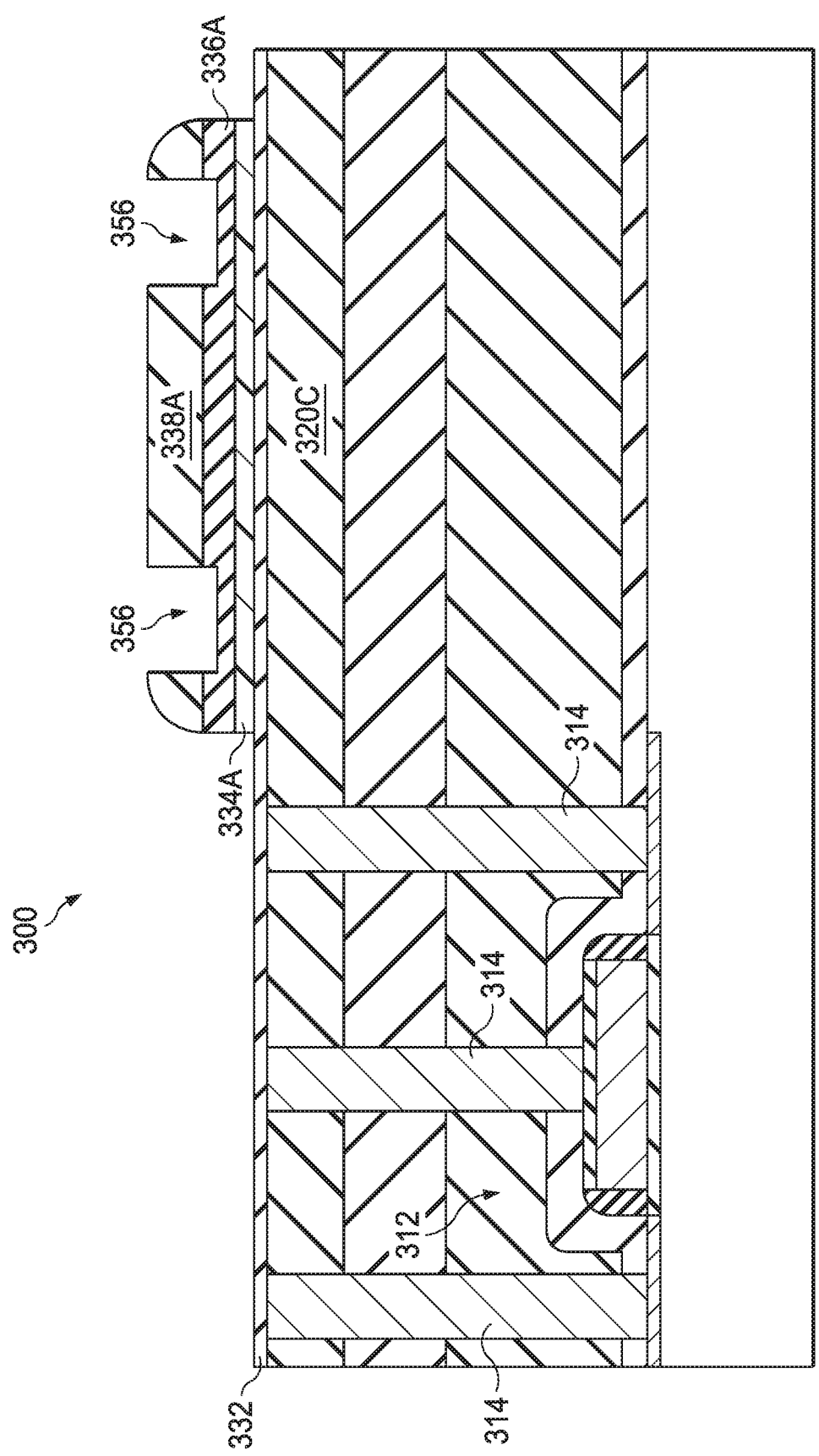

As shown in FIG. 3G, remaining portions of the second photomask 350 of FIG. 3F may be removed, e.g., by a resist strip. In some embodiments, a chemical clean may be used to remove remaining portions of the second photomask 350 because underlying IC structures, e.g., the tungsten vias 314, are protected by the dielectric etch stop layer 332.

Figure 3H:
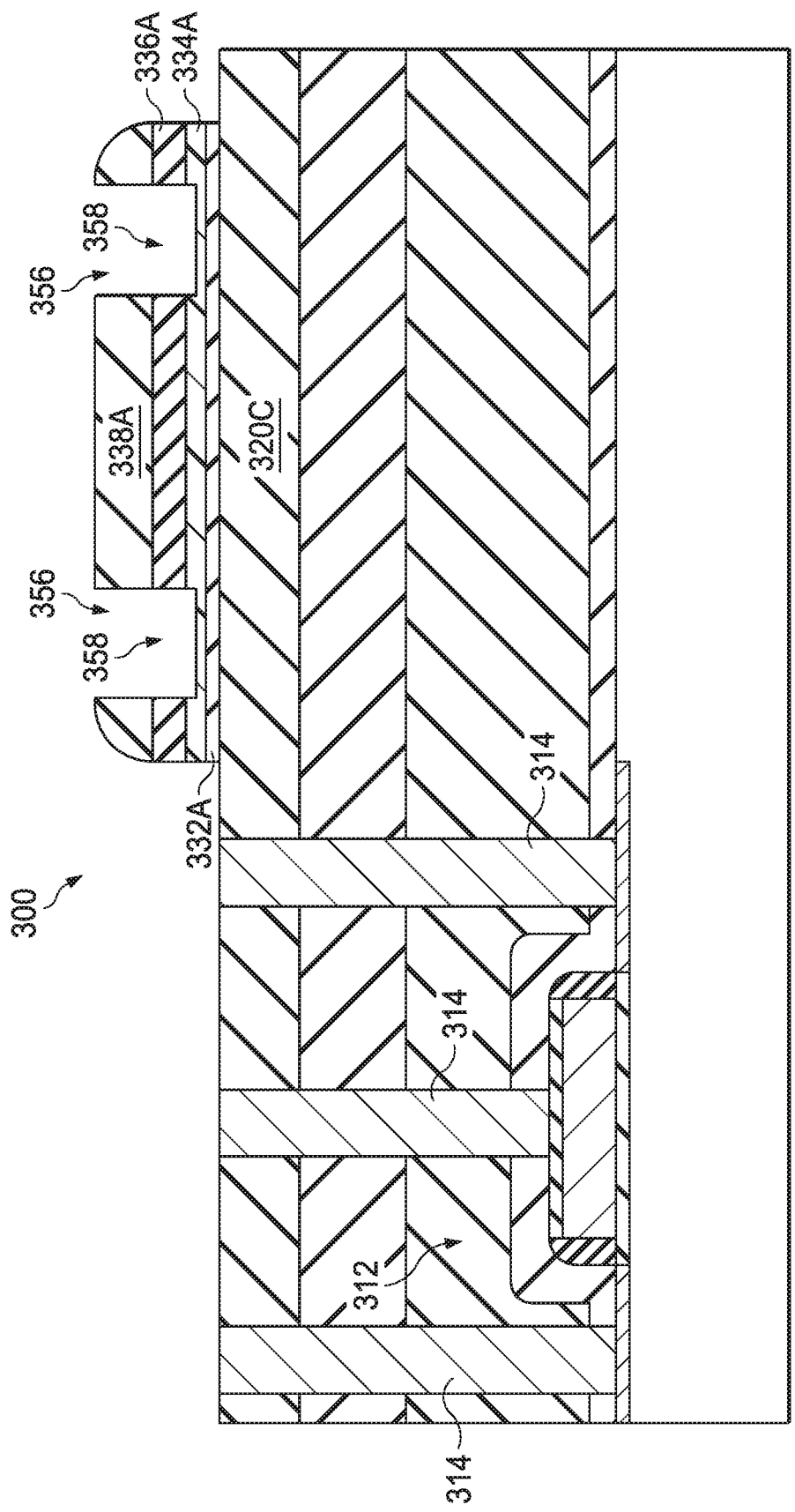

As shown in FIG. 3H, a second TFR contact etch may be performed to (a) remove portions of the dielectric etch stop layer 332 of FIG. 3G exposed through the oxide cap openings 356 in the oxide cap 338A to define TFR contact openings 358 that expose a top surface of the TFR element 334A and (b) remove portions of the dielectric etch stop layer 332 of FIG. 3G exposed outside the perimeter of the oxide cap 340, which may expose a top surface of the PMD cap layer 320C and the underlying tungsten contacts 314. In an embodiment in which dielectric etch stop layer 332 comprises a SiN layer, the second TFR contact etch may comprise a gentle SiN clear etch with high selectivity to oxide, to protect the underlying tungsten contacts 314.

Figure 3I:
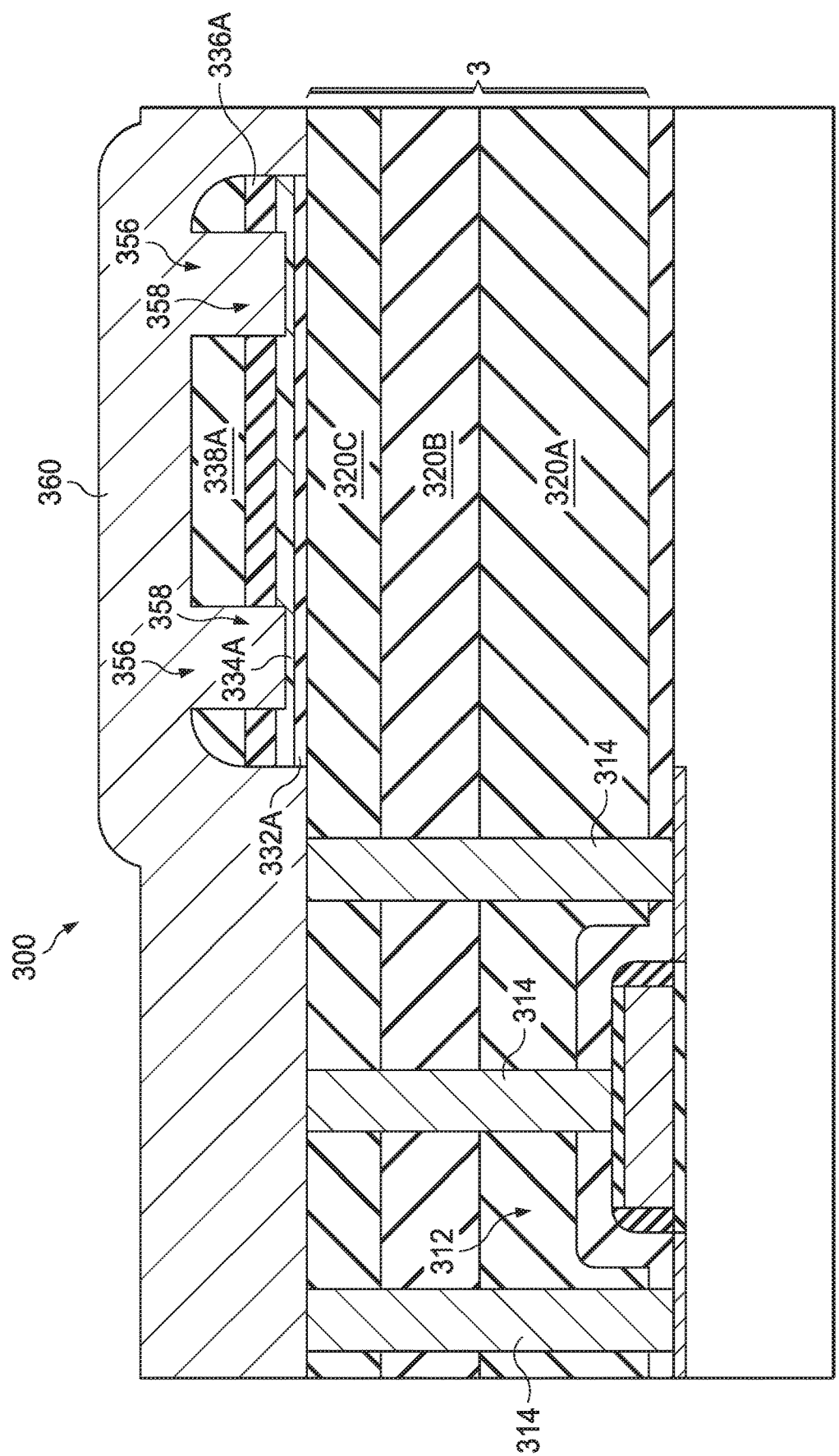

As shown in FIG. 3I, the IC device processing may continue, by forming a first metal layer/interconnect layer, referred to as a "Metal 1" layer 360. In the illustrated embodiment, Metal 1 layer 360 comprises aluminum. In other embodiments, Metal 1 layer 360 may comprise copper or other metal. As shown, Metal 1 layer 360 extends into the oxide cap openings 356 and TFR contact openings 358, to thereby contact the TFR element 334A at disparate contact locations of the TFR element 334A. Metal 1 layer 360 also extends over and in contact with tungsten contacts 314.

Figure 3J:
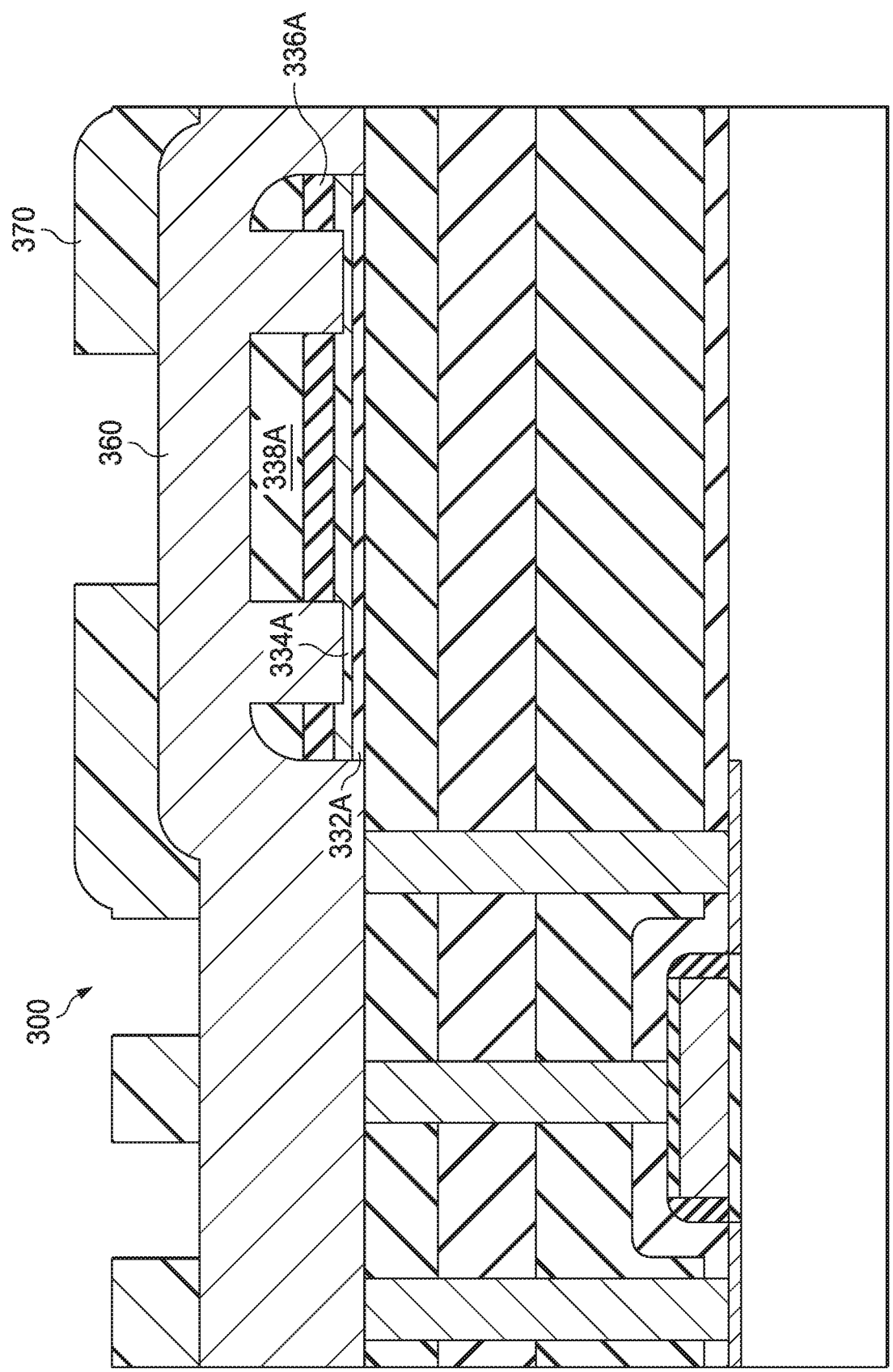

Next, as shown in FIG. 3J, a third photomask 370 may be formed and patterned over the Metal 1 layer.

Figure 3K:
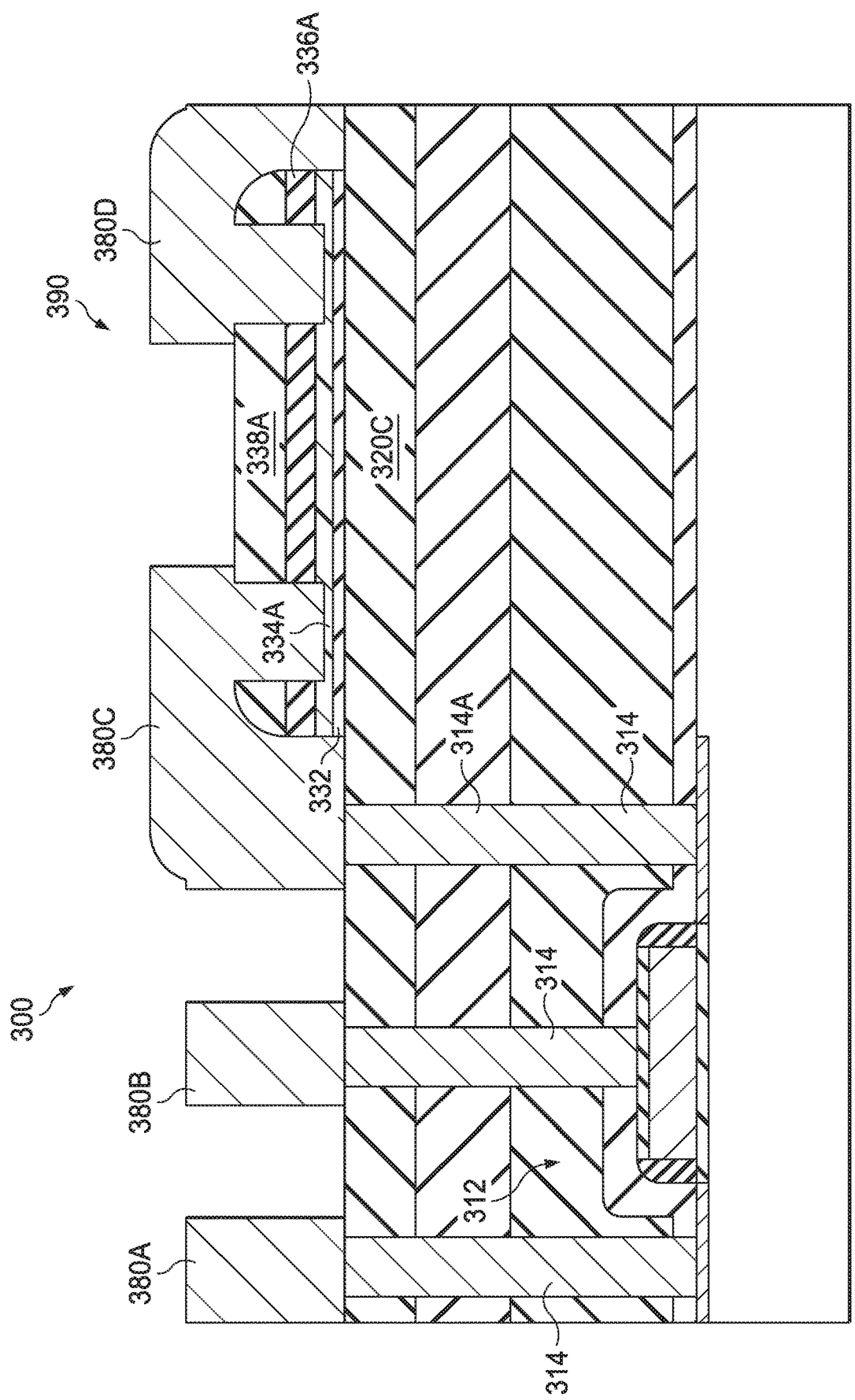

Finally, as shown in FIG. 3K, the aluminum Metal 1 layer 360 may be etched using the third photomask 370 to define a plurality of aluminum Metal 1 elements (e.g., metal interconnect elements) 380A-380D, and the remaining photoresist material 370 of FIG. 3J may then be removed. For example, as shown, the Metal 1 layer may be etched to define aluminum interconnect elements 380A and 380B in contact with tungsten vias 314, and aluminum interconnect elements 380C and 380D in contact with the disparate contact locations of the TFR element 334A. In this example illustration, a first aluminum interconnect element 380C conductively connects a first contact location of the TFR element 334A with a tungsten via 314A coupled to a source or drain region of the transistor 312, and a second interconnect element 380D conductively contacts a second contact location of the TFR element 334A with other IC element structure(s). The TFR element 334A and the first and second interconnect elements 380C and 380D collectively define an integrated TFR, indicated at 390.

As discussed below, e.g., with respect to FIGS. 4A-4C and 5A-5C, the rounded upper corners 337 of the oxide cap 338A may facilitate the removal of selected portions of the Metal 1 layer 360 adjacent selected lateral edges of the TFR element 234A, e.g., to further prevent electrical shorts ("stringers") in the completed device.

Figure 4A:
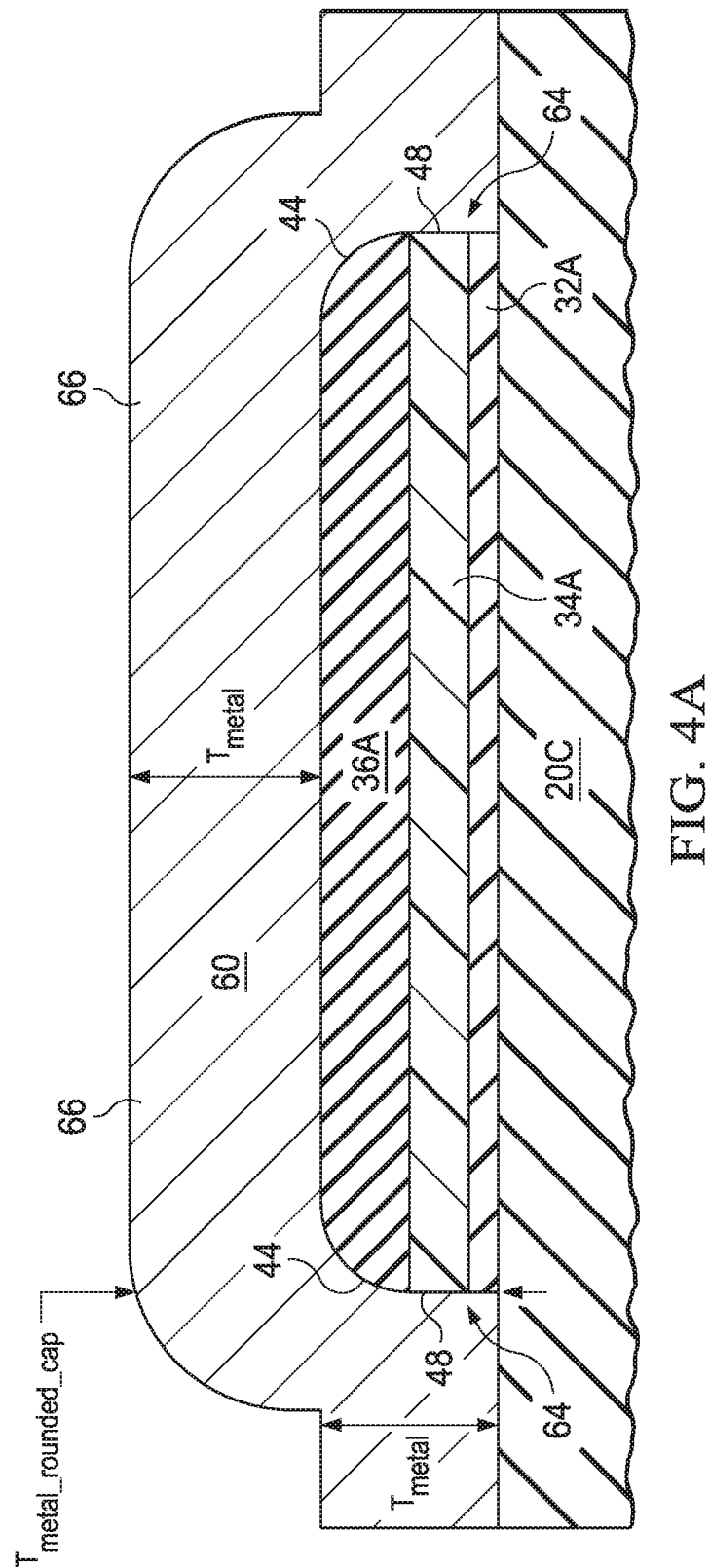
FIGS. 4A-4C and 5A-5C illustrate how rounded lateral edges of a TFR oxide cap can prevent or reduce the occurrence of electrical shorts (often referred to as "stringers") in an integrated TFR. More particularly.
Figure 4B:
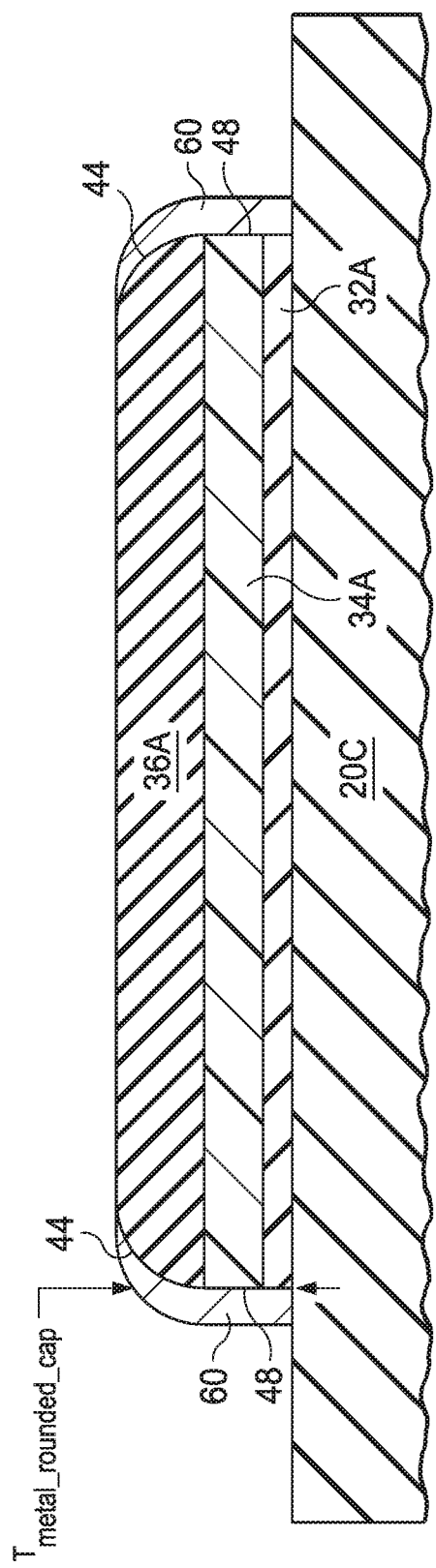
Figure 4C:
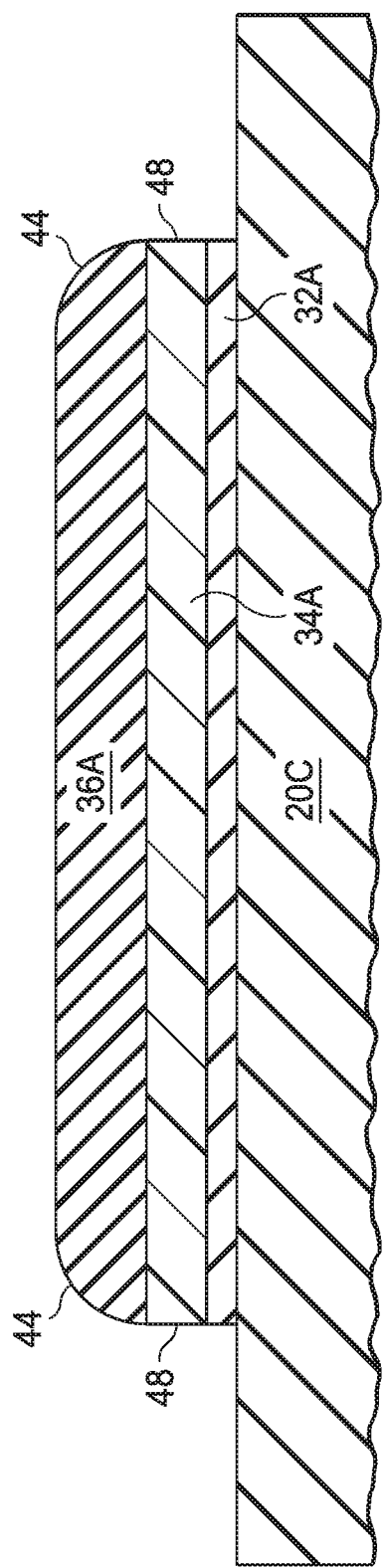
Figure 5A:
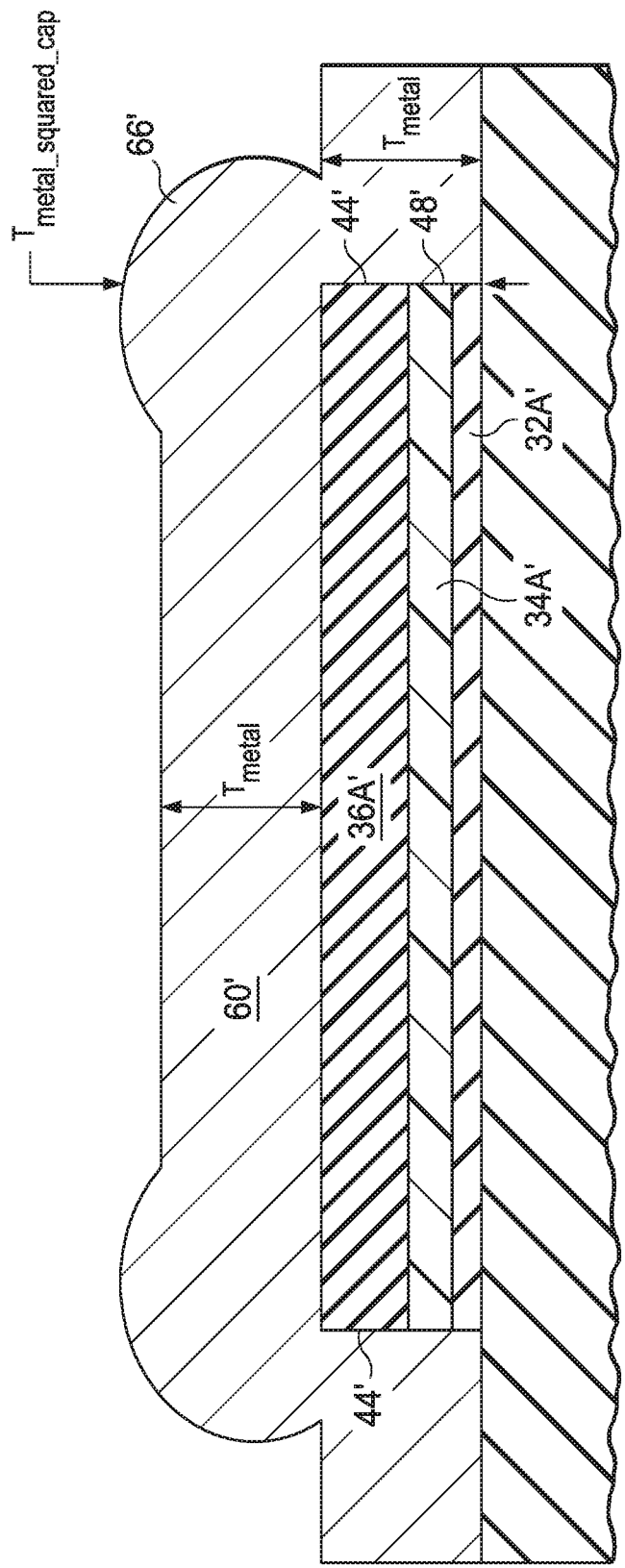
Figure 5B:
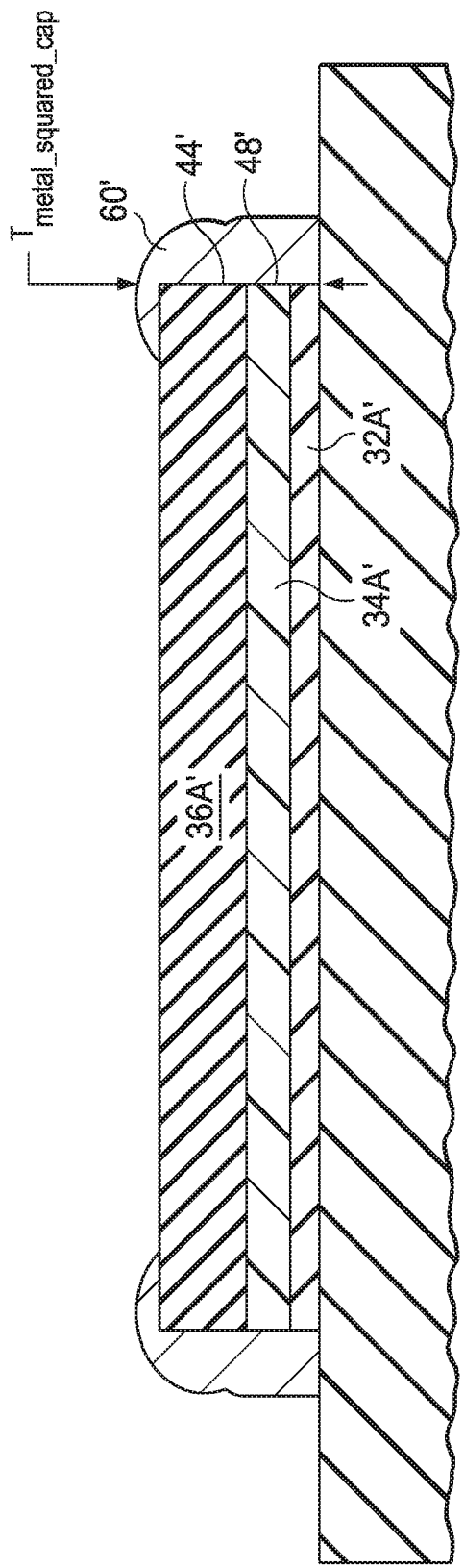
Figure 5C:
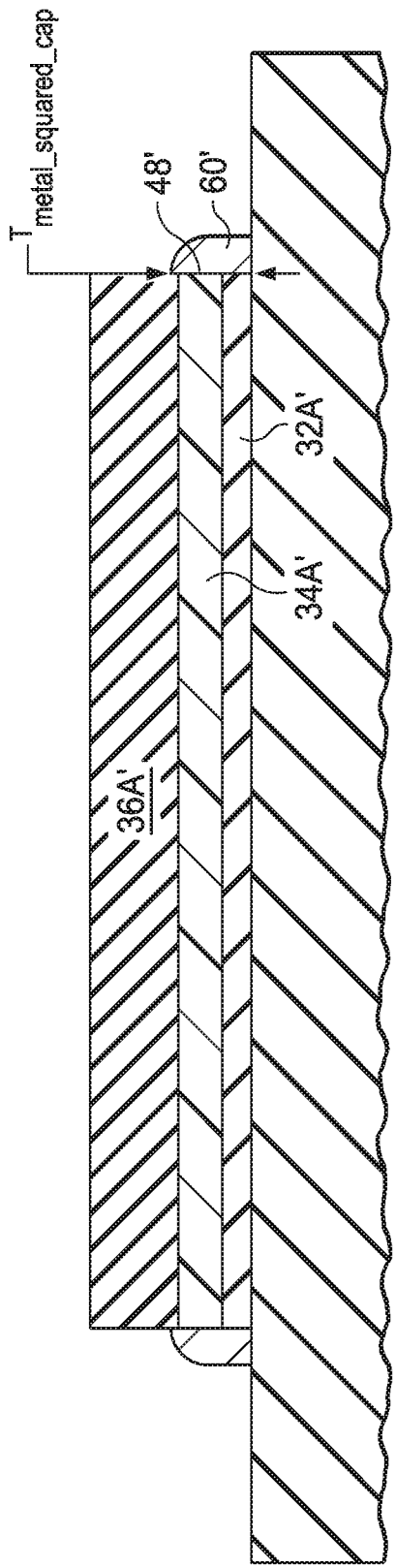

FIGS. 4A-4C and 5A-5C provide an example illustration of how the rounded upper corners 237 of the TFR hardmask cap 236A (in the embodiment of FIGS. 2A-2M) or the rounded upper corners 337 of the oxide cap 338A (in the embodiment of FIGS. 3A-3K) can facilitate the removal of selected portions of relevant metal layer (Metal 1 layer 260 or 360) to physically separate interconnect elements (e.g., elements 280C and 280D, or elements 380C and 380D from each other), as compared with a similar structure having a TFR oxide cap with vertical ("squared-off") lateral edges. FIGS. 4A-4C are cross-section views of a selected portion of an example IC structure 10 taken through a TFR element 34, in a direction perpendicular to the cross-sections shown in FIGS. 2A-2M and 3A-3K. As shown, a TFR cap 36A with rounded upper corners 44 is formed over the TFR element. In contrast, FIGS. 5A-5C are cross-section views of a selected portion of an IC structure 10' similar to IC structure 10 but having a TFR cap with vertical ("squared-off") lateral edges, as opposed to the rounded upper corners 44 of the TFR cap 36A shown in FIGS. 4A-4C.

FIGS. 4A and 5A show (a) the selected portion of IC structure 10 after deposition of a metal layer 60 over the TFR cap 36A having rounded upper corners 44, referred to below as rounded oxide cap edges 44 (FIG. 4A) and the selected portion of IC structure 10' after deposition of a metal layer 60' over the TFR cap 36A' having vertical lateral edges 44'. The same metal thickness, indicated as $T_{metal}$, is deposited for metal layer 60 and metal layer 60'.

FIG. 4A corresponds with a state of the IC structure after forming and patterning a photomask above the metal layer 60 and prior to a metal etch to define metal elements, e.g., elements 280A-280D shown in FIG. 2M or 380A-380D in FIG. 3K. In this example, the metal 60 in the illustrated cross-section should be fully removed by the metal etch in order to remove any conductive connection provided by metal 60 between the remaining metal interconnect elements, namely the metal contacts on opposing sides of the respective TFR element 34A (for example interconnect elements 280C and 280D shown in FIG. 2M or interconnect elements 380C and 380D shown in FIG. 3K), to thereby prevent electrical shorts ("stringers") across the TFR element 34A. As shown in FIGS. 4A and 5A, the thickest portions of metal layer 60 and 60' are located adjacent the lateral edges 48 and 48' of the TFR elements 34A and 34A', indicated generally at locations 64 and 64', and thus the metal etch should be sufficient to remove the full metal thickness in these locations. As explained below, the rounded upper corners 44 of the TFR cap 36A reduce the metal thickness in these locations, thus reducing the required metal etch parameter(s), e.g., etching time or etching intensity.

Metal layers 60 and 60' shown in FIGS. 4A and 5A may each comprise an aluminum layer, e.g., Al, AlCu, and AlSiCu, applied as a sputtered film. As know in the art, physical sputtered films such as Al, AlCu, and AlSiCu are typically not fully conformal. "Bread-loafing" occurs above the upper corners of physical structures, e.g., as shown in FIG. 4A at 66, and in FIG. 5A at 66'. As shown, the rounded TFR cap corners 44 shown in FIG. 4A reduce the extent of "bread-loafing" at the upper corners, as compared with the vertical TFR cap edges 44' shown in FIG. 5A. This reduced "bread-loafing" effect, along with the rounded contour of metal layer 60 over the rounded TFR cap corners 44, results in a vertical metal thickness $T_{metal\_rounded\_cap}$ adjacent the lateral edges 48 of the TFR element 34A (i.e., at locations 64 shown in FIG. 4), that is less than a vertical metal thickness $T_{metal\_squared\_cap}$ adjacent the lateral edges 48' of the TFR element 34A' of IC structure 10' (i.e., at locations 64' shown in FIG. 5). Thus, viewing $T_{metal\_rounded\_cap}$ in comparison to the lesser $T_{metal\_squared\_cap}$, it can be seen that the maximum vertical thickness of metal to be removed during the metal etch (to prevent electrical shorts across the TFR element 34A or 34A') is reduced as a result of the rounded TFR cap corners 44, as compared with vertical TFR cap edges 44'.

FIGS. 4B and 5B show the selected portions of IC structure 10 and IC structure 10' during the metal etch to remove each metal layer 60 and 60'. In particular, FIGS. 4B and 5B shows a state during the etch at which the horizontal regions of each metal layer 60 and 60', each having thickness $T_{metal}$, have been removed, while regions of metal layers 60 and 60' at the lateral edges 48, 48' of each TFR element 34A, 34A' still remain. As shown, the maximum remaining metal thickness $T_{metal\_rounded\_cap}$ in the structure having rounded TFR cap corners 44 (FIG. 4B), is smaller than the maximum remaining metal thickness $T_{metal\_squared\_cap}$ in the structure having squared TFR cap edges 44' (FIG. 5B), and thus requires a shorter etch time (or etch intensity) to remove fully.

FIGS. 4C and 5C show the selected portions of IC structure 10 and IC structure 10' after additional etch time (over etch), in particular at a time at which the thickest regions of metal layer 60 (at $T_{metal\_rounded\_cap}$) have been fully removed. As shown, in the structure having squared TFR cap edges 44' (FIG. 5C), a thickness of metal 60' (indicated at $T_{metal\_squared\_cap}$) still remains at the time when the metal layer 60 in IC structure 10 (FIG. 4C) has been fully removed. Thus, the rounded TFR cap corners 44 formed in IC structure 10 may reduce the etch time (or etch intensity) required to fully remove the metal 60 to prevent electrical shorts across the TFR element 34A. The reduced etch time (or etch intensity) allows for a thinner photoresist, which allows for tighter metal line spacing in IC structure 10, e.g., as compared with an IC structure using squared TFR cap edges 44' (FIGS. 5A-5C). This reduction in metal line spacing may allow for an overall reduction in the size of IC structure 10, which may allow for more IC devices per wafer, which may reduce the cost per device.

Although the disclosed embodiments are described in detail in the present disclosure, it should be understood that various changes, substitutions and alterations can be made to the embodiments without departing from their spirit and scope.

The invention claimed is:

1. A method of forming an integrated thin film resistor (TFR) in a semiconductor integrated circuit device, the method comprising:
   forming an integrated circuit (IC) structure including a plurality of IC elements and a plurality of conductive IC element contacts connected to the plurality of IC elements;
   forming a TFR film layer over the IC structure;
   forming a TFR hardmask cap layer over the TFR film layer;
   forming and patterning a photomask over the TFR hardmask cap layer;
   performing a first etch process to remove selected portions of the TFR hardmask cap layer, thereby defining a TFR hardmask cap, wherein the first etch process stops at the TFR film layer;
   removing the photomask;
   after removing the photomask, performing a second etch process, using the TFR hardmask cap as a hardmask, to remove selected portions of the TFR film layer, to thereby define a TFR element under the TFR hardmask cap;
   after the second etch process, forming an oxide cap layer;
   performing a third etch process to form at least one oxide cap opening in the oxide cap layer over the TFR element;
   performing a fourth etch process through the at least one oxide cap opening to form at least one TFR contact opening in the TFR hardmask cap over the TFR element, thereby exposing a surface of the TFR element;
   forming a metal interconnect layer over the IC structure and including (a) at least one metal interconnect element coupled to at least one of the plurality of conductive IC element contacts and (b) at least one metal interconnect extending into the at least one TFR contact opening to contact the underlying TFR element; and
   at some time after forming the TFR film layer and before forming the metal interconnect layer, performing a TFR anneal to anneal the TFR film layer or the TFR element.

2. The method of claim 1, wherein the TFR hardmask cap layer comprises silicon nitride (SiN).

3. The method of claim 1, wherein the second etch process rounds upper corners of the TFR hardmask cap.

4. The method of claim 1, further comprising forming a dielectric etch stop layer over the IC structure prior to forming the TFR film layer;
   wherein the second etch stops at the dielectric etch stop layer.

5. The method of claim 1, wherein the integrated circuit structure includes a memory cell or transistor structure including at least one conductive IC element contact connected to at least one of a source region, a drain region, and a gate region of the memory cell or transistor structure.

6. The method of claim 1, wherein the TFR film layer comprises silicon carbide chromium (SiCCr), silicon chromium (SiCr), chromium silicon nitride (CrSiN), tantalum nitride (TaN), tantalum silicide ($Ta_2Si$), or titanium nitride (TiN).

7. The method of claim 1, wherein the metal interconnect layer comprises aluminum.

8. The method of claim 1, wherein the TFR anneal comprises an anneal at a temperature of at least 500° C.

9. A method of forming an integrated thin film resistor (TFR) in a semiconductor integrated circuit device, the method comprising:
   forming an integrated circuit (IC) structure including a plurality of IC elements and a plurality of conductive IC element contacts connected to the plurality of IC elements;
   forming a TFR film layer over the IC structure;
   forming an etch stop cap layer over the TFR film layer;
   forming an oxide cap layer over the etch stop cap layer;
   forming and patterning a photomask over the oxide cap layer;

performing a first etch process to remove selected portions of the oxide cap layer, to thereby define an oxide cap;
removing the photomask;
after removing the photomask, performing a second etch process, in which the oxide cap acts as a hardmask, to remove selected portions of the TFR film layer, to thereby define a TFR element under the oxide cap;
performing a third etch process to form at least one oxide cap opening in the oxide cap over the TFR element;
performing a fourth etch process through the at least one oxide cap opening to form at least one TFR contact opening in the etch stop cap over the TFR element, thereby exposing a surface of the TFR element;
forming a metal interconnect layer over the IC structure and including (a) at least one metal interconnect element coupled to at least one of the plurality of conductive IC element contacts and (b) at least one metal interconnect extending into the at least one TFR contact opening to contact the underlying TFR element; and
at some time after forming the TFR film layer and before forming the metal interconnect layer, performing a TFR anneal to anneal the TFR film layer or the TFR element.

10. The method of claim 9, wherein the second etch process rounds upper corners of the oxide cap.

11. The method of claim 9, wherein the first etch process to remove selected portions of the oxide cap layer, to thereby define the oxide cap stops at the etch stop cap layer; and the second etch removes exposed portions of the etch stop cap layer outside the oxide cap to thereby define an etch stop cap under the oxide cap and over the TFR element.

12. The method of claim 9, further comprising forming a dielectric etch stop layer over the IC structure prior to forming the TFR film layer;
wherein the TFR etch stops at the dielectric etch stop layer.

13. The method of claim 9, wherein the integrated circuit structure includes a memory cell or transistor structure including at least one conductive IC element contact connected to at least one of a source region, a drain region, and a gate region of the memory cell or transistor structure.

14. The method of claim 9, wherein the metal interconnect layer comprises aluminum.

15. The method of claim 9, wherein the TFR anneal comprises an anneal at a temperature of at least 500° C.

16. A method of forming an integrated thin film resistor (TFR) in a semiconductor integrated circuit device, the method comprising:
forming an integrated circuit (IC) structure including a plurality of IC elements and a plurality of conductive IC element contacts connected to the plurality of IC elements;
forming a TFR film layer over the IC structure;
forming a TFR hardmask cap layer over the TFR film layer;
forming and patterning a photomask over the TFR hardmask cap layer;
performing a first etch process to remove selected portions of the TFR hardmask cap layer, thereby defining a TFR hardmask cap, wherein the first etch process stops at the TFR film layer;
performing a second etch process, using the TFR hardmask cap as a hardmask, to remove selected portions of the TFR film layer, to thereby define a TFR element under the TFR hardmask cap;
after the second etch process, forming an oxide cap layer; and
performing a third etch process to form at least one oxide cap opening in the oxide cap layer over the TFR element.

17. The method of claim 16, comprising:
performing a fourth etch process through the at least one oxide cap opening to form at least one TFR contact opening in the TFR hardmask cap over the TFR element; and
forming a metal interconnect layer over the IC structure and including at least one metal interconnect extending into the at least one TFR contact opening to contact the underlying TFR element.

18. The method of claim 17, comprising, after forming the TFR film layer and before forming the metal interconnect layer, performing a TFR anneal to anneal the TFR film layer or the TFR element.

19. The method of claim 16, wherein the TFR hardmask cap layer comprises silicon nitride (SiN).

20. A method of forming an integrated thin film resistor (TFR) in a semiconductor integrated circuit device, the method comprising:
forming an integrated circuit (IC) structure including a plurality of IC elements and a plurality of conductive IC element contacts connected to the plurality of IC elements;
forming a TFR film layer over the IC structure;
forming an etch stop cap layer over the TFR film layer;
forming an oxide cap layer over the etch stop cap layer;
forming and patterning a photomask over the oxide cap layer;
performing a first etch process to remove selected portions of the oxide cap layer, to thereby define an oxide cap;
performing a second etch process, in which the oxide cap acts as a hardmask, to remove selected portions of the TFR film layer, to thereby define a TFR element under the oxide cap; and
performing a third etch process to form at least one oxide cap opening in the oxide cap over the TFR element.

21. The method of claim 20, comprising:
performing a fourth etch process through the at least one oxide cap opening to form at least one TFR contact opening in the etch stop cap over the TFR element; and
forming a metal interconnect layer over the IC structure and including at least one metal interconnect extending into the at least one TFR contact opening to contact the underlying TFR element.

22. The method of claim 21, comprising, after forming the TFR film layer and before forming the metal interconnect layer, performing a TFR anneal to anneal the TFR film layer or the TFR element.

23. The method of claim 20, wherein the first etch process to remove selected portions of the oxide cap layer, to thereby define the oxide cap stops at the etch stop cap layer; and the second etch removes exposed portions of the etch stop cap layer outside the oxide cap to thereby define an etch stop cap under the oxide cap and over the TFR element.

* * * * *